(12) United States Patent
Gans

(10) Patent No.: US 11,599,474 B2
(45) Date of Patent: Mar. 7, 2023

(54) STACKED MEMORY DICE FOR COMBINED ACCESS OPERATIONS

(71) Applicant: Micron Technology, Inc., Boise, ID (US)

(72) Inventor: Dean D. Gans, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/538,269

(22) Filed: Nov. 30, 2021

(65) Prior Publication Data
US 2022/0164290 A1    May 26, 2022

Related U.S. Application Data

(62) Division of application No. 16/778,151, filed on Jan. 31, 2020, now Pat. No. 11,194,726.
(Continued)

(51) Int. Cl.
*G06F 12/0862* (2016.01)
*G06F 13/16* (2006.01)
(Continued)

(52) U.S. Cl.
CPC ...... *G06F 12/0862* (2013.01); *G06F 13/1668* (2013.01); *G11C 11/4093* (2013.01);
(Continued)

(58) Field of Classification Search
CPC ......... G06F 2212/6028; G06F 12/0607; G06F 13/4247; G06F 2212/6026; G06F 3/061;
(Continued)

(56) References Cited

U.S. PATENT DOCUMENTS

| | | |
|---|---|---|
| 3,706,975 A | 12/1972 | Paluck |
| 4,577,064 A | 3/1986 | Huft et al. |
| | (Continued) | |

FOREIGN PATENT DOCUMENTS

| | | |
|---|---|---|
| CN | 1710665 A | 12/2005 |
| CN | 102298957 A | 12/2011 |

OTHER PUBLICATIONS

CN 111383676 A; Rehmeyer et al., all pages, Jul. 7, 2020. (Year: 2020).*
(Continued)

*Primary Examiner* — Fernando Hidalgo
(74) *Attorney, Agent, or Firm* — Holland & Hart LLP

(57) ABSTRACT

Methods, systems, and devices for stacked memory dice and combined access operations are described. A device may include multiple memory dice. One die may be configured as a master, and another may be configured as a slave. The master may communicate with a host device. A slave may be coupled with the master but not the host device. The device may include a first die (e.g., master) and a second die (e.g., slave). The first die may be coupled with a host device and configured to output a set of data in response to a read command. The first die may supply a first subset of the data and obtain a second subset of the data from the second die. In some cases, the first die may select, based on a data rate, a modulation scheme (e.g., PAM4, NRZ, etc.) and output the data using the selected modulation scheme.

20 Claims, 10 Drawing Sheets

Related U.S. Application Data

(60) Provisional application No. 62/810,037, filed on Feb. 25, 2019.

(51) Int. Cl.
 *H01L 25/065* (2023.01)
 *G11C 11/4093* (2006.01)

(52) U.S. Cl.
 CPC .. *H01L 25/0657* (2013.01); *G06F 2212/6028* (2013.01); *H01L 2225/0651* (2013.01); *H01L 2225/06541* (2013.01); *H01L 2225/06562* (2013.01)

(58) Field of Classification Search
 CPC ... H01L 2225/0651; H01L 2225/06541; H01L 2225/06562; H01L 2224/16145; H01L 2224/48145; H01L 2224/48227; H01L 2225/06506; H01L 2225/06513; H01L 2924/15311; G11C 5/0563; G11C 2207/107; G11C 5/025; G11C 5/04; G11C 7/1015; G11C 2207/105; Y02D 10/00
 USPC .......................................................... 711/154
 See application file for complete search history.

(56) References Cited

U.S. PATENT DOCUMENTS

| | | | |
|---|---|---|---|
| 5,706,225 | A | 1/1998 | Buchenrieder et al. |
| 5,879,972 | A | 3/1999 | Umeki |
| 6,779,076 | B1 | 8/2004 | Shirley |
| 6,981,089 | B2 | 12/2005 | Dodd et al. |
| 7,948,792 | B1 | 5/2011 | Lee et al. |
| 9,761,312 | B1 | 9/2017 | Kajigaya |
| 9,921,763 | B1 | 3/2018 | Zitlaw |
| 10,032,496 | B1 | 7/2018 | Bedeschi et al. |
| 10,388,355 | B1 | 8/2019 | Ware et al. |
| 10,878,899 | B1 | 12/2020 | Islam et al. |
| 2003/0022427 | A1 | 1/2003 | Ferrant et al. |
| 2003/0223272 | A1 | 12/2003 | Mihnea et al. |
| 2004/0148482 | A1 | 7/2004 | Grundy et al. |
| 2006/0095592 | A1 | 5/2006 | Borkenhagen |
| 2007/0247885 | A1 | 10/2007 | Watanabe et al. |
| 2008/0175088 | A1 | 7/2008 | Choi et al. |
| 2008/0205147 | A1 | 8/2008 | Santin et al. |
| 2009/0027972 | A1 | 1/2009 | Bode |
| 2009/0103365 | A1 | 4/2009 | Roohparvar et al. |
| 2009/0206680 | A1 | 8/2009 | Chun et al. |
| 2009/0268520 | A1 | 10/2009 | Roohparvar |
| 2011/0080796 | A1 | 4/2011 | Bruennert et al. |
| 2012/0008375 | A1 | 1/2012 | Tay |
| 2012/0127781 | A1 | 5/2012 | Saito |
| 2014/0064010 | A1 | 3/2014 | Barkley et al. |
| 2014/0078815 | A1 | 3/2014 | Hollis |
| 2014/0233330 | A1 | 8/2014 | Ko et al. |
| 2014/0269011 | A1 | 9/2014 | Dally et al. |
| 2014/0321202 | A1 | 10/2014 | Yang et al. |
| 2015/0199133 | A1 | 7/2015 | Abdulla et al. |
| 2015/0229303 | A1 | 8/2015 | Li |
| 2015/0234746 | A1 | 8/2015 | Jo |
| 2015/0255138 | A1 | 9/2015 | Rodriguez-latorre et al. |
| 2015/0263069 | A1 | 9/2015 | Jo |
| 2016/0372180 | A1 | 12/2016 | Amara et al. |
| 2017/0003779 | A1 | 1/2017 | Reynolds et al. |
| 2017/0358327 | A1 | 12/2017 | Oh et al. |
| 2018/0034374 | A1 | 2/2018 | Breen et al. |
| 2018/0061468 | A1 | 3/2018 | Derner et al. |
| 2018/0129259 | A1* | 5/2018 | Yoo ...................... G06F 1/3275 |
| 2018/0137909 | A1 | 5/2018 | Shaeffer et al. |
| 2019/0051352 | A1 | 2/2019 | Mccollum |
| 2019/0115092 | A1 | 4/2019 | Tsai et al. |
| 2019/0164591 | A1 | 5/2019 | Takahashi et al. |
| 2019/0189190 | A1 | 6/2019 | Di Vincenzo et al. |
| 2019/0198103 | A1 | 6/2019 | Yang et al. |
| 2019/0198106 | A1 | 6/2019 | Parkinson et al. |
| 2019/0252612 | A1 | 8/2019 | Tortorelli et al. |
| 2019/0259462 | A1 | 8/2019 | Lu et al. |
| 2019/0267096 | A1 | 8/2019 | Yang et al. |
| 2019/0280688 | A1 | 9/2019 | Ruffieux et al. |
| 2019/0295671 | A1 | 9/2019 | Bang et al. |
| 2019/0325934 | A1 | 10/2019 | Matsubara |
| 2019/0385680 | A1 | 12/2019 | Dunga et al. |
| 2020/0081848 | A1 | 3/2020 | Bae et al. |
| 2020/0142832 | A1* | 5/2020 | Wallach ............... G06F 12/0842 |
| 2021/0263651 | A1* | 8/2021 | Sandvig ................ G06F 3/0632 |
| 2021/0279183 | A1* | 9/2021 | Morgan .............. G06F 12/0238 |
| 2022/0004455 | A1* | 1/2022 | Oh ....................... G06F 12/0238 |

OTHER PUBLICATIONS

China National Intellectual Property Administration, "First Office Action," issued in connection with Chinese Patent Application No. 202010080788.7, dated Mar. 11, 2021 (14 pages with translation).
International Search Report and Written Opinion received for PCT Patent Application No. PCT/US20/16946, dated Jun. 5, 2020, 16 pages.
"European Supplementary search report and Search opinion of the European Searching Authority," issued in connection with EP Appl. No. 20762393.5, dated Apr. 19, 2022 (11 pages).

\* cited by examiner

STACKED MEMORY DICE FOR COMBINED ACCESS OPERATIONS

CROSS REFERENCE

The present Applications for patent is a divisional of U.S. patent application Ser. No. 16/778,151 by GANS et al., entitled "STACKED MEMORY DICE FOR COMBINED ACCESS OPERATIONS," filed Jan. 31, 2020, which claims the benefit of U.S. Provisional Patent Application No. 62/810,037 by GANS et al., entitled "STACKED MEMORY DICE FOR COMBINED ACCESS OPERATIONS," filed Feb. 25, 2019, each of which is assigned to the assignee hereof, and each of which is expressly incorporated by reference herein.

BACKGROUND

The following relates generally to a system that includes at least one memory device and more specifically to stacked memory dice for combined access operations.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving memory systems, generally, may include reducing system power consumption, increasing memory system capacity, improving read/write speeds (e.g., bandwidth), providing non-volatility by use of persistent main memory, or reducing manufacturing costs at a certain performance point, among other metrics.

DETAILED DESCRIPTION

Figure 1:
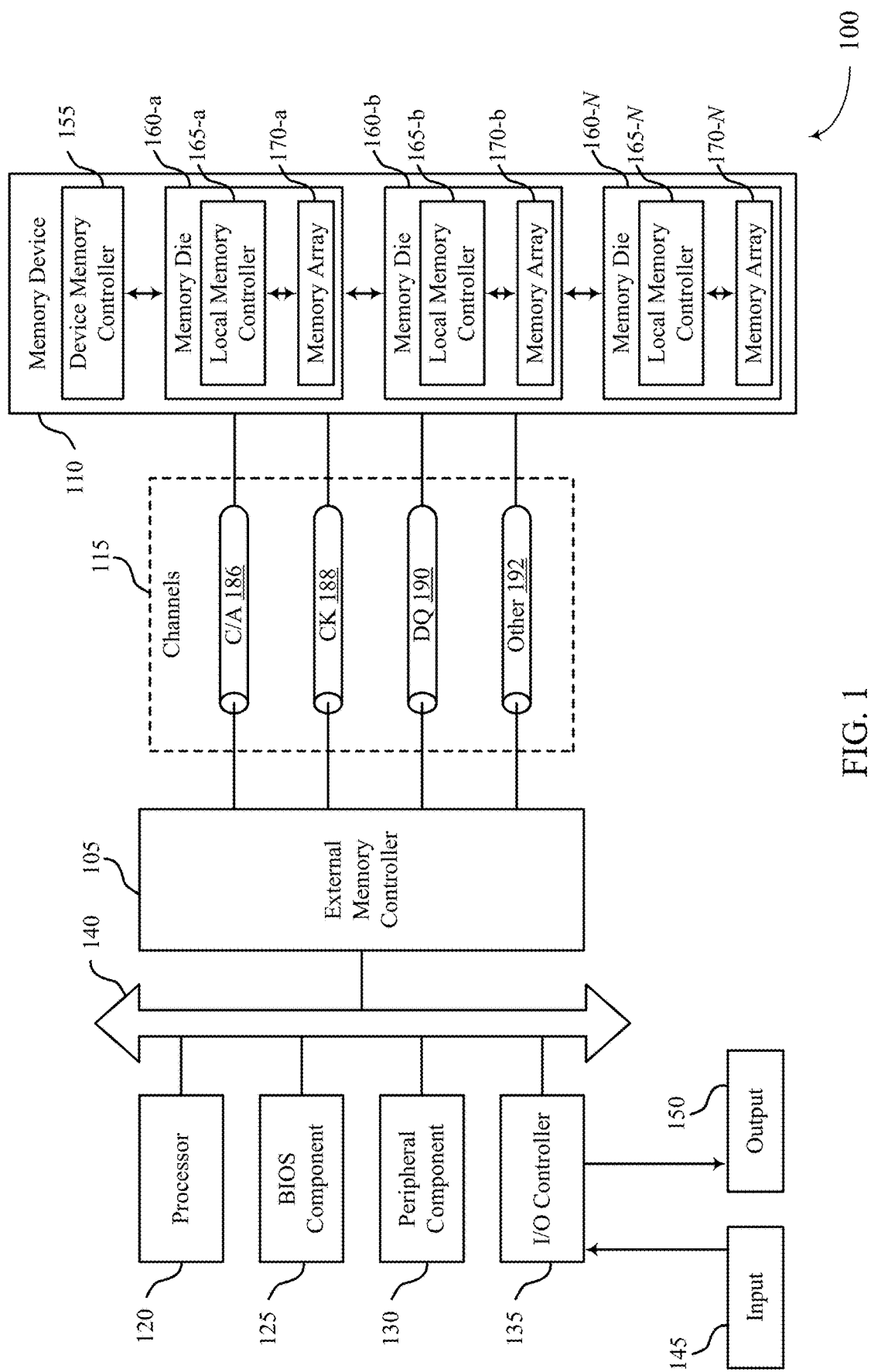
FIG. 1 illustrates an example of a system that supports stacked memory dice for combined access operations in accordance with examples as disclosed herein.

Some memory devices may operate in environments in which a high data rate (exchanging a large amount of data in a given amount of time) between a host device and the memory device—e.g., high-bandwidth operations—is desired. Mobile systems, among others, may be one example of such environments. In some examples, increasing pin count of the system (e.g., increased pin count of the memory device) may facilitate increased bandwidth (e.g., an increased maximum data rate) but may increase cost and complexity of the system—e.g., due to increased package size (e.g., for package on package (PoP) implementations), increased complexity of an associated printed circuit board (PCB) layout—or may have other drawbacks. In some cases, increasing a clock speed of the memory device may facilitate increased bandwidth (e.g., an increased maximum data rate) but an extent to which the clock speed may be increased may be limited in practice by power, efficiency, circuit complexity, timing margin, or other constraints.

Apparatuses including stacked memory dice and operations of the same are described which may, for example, support increased bandwidth between a memory device and other devices, such as a host device for the memory device. Further, the devices and techniques described herein may not be dependent upon increased pin count or clock rates or may have other benefits. For example, the apparatus may include multiple memory dice (e.g., stacked memory dice above a substrate). One memory die may be configured as a master die, and one or more other memory dice may each be configured as a slave die. The master die may be coupled with and communicate with a host device. A slave die may be coupled with the master die but otherwise not connected with the host device. In response to a read command, the memory device may execute a prefetch operation in which the master die provides a first subset of prefetched data (e.g., a first half of the prefetched data) and the slave die provides a second subset of prefetched data (e.g., a second half of the prefetched data). For example, the master die and the slave die may each be configured to support prefetching a certain amount of data, which may be referred to as a prefetch size, and the total amount of prefetched data (data prefetched by the memory device in response to the read command) may be double the prefetch size.

In some cases, the master die may output the second subset of data immediately following the first subset of data (e.g., no time delay or time bubble) to provide the set of data associated with the read command to the host device. Further, the master die may support both binary signaling and multi-level signaling for exchanging data with the host device. For example, the master die may receive, from the host device, an indication of whether to use binary signaling or multi-level signaling to output the set of data associated with the read command (e.g., an indication of a data rate to support certain bandwidths). In some cases, the master die may select, based on the indicated or an otherwise determined data rate, a modulation scheme from a set that includes a higher-order (non-binary) modulation scheme (e.g., pulse amplitude modulation 3 (PAM3) or pulse amplitude modulation 4 (PAM4) signaling) and a binary modulation scheme (e.g., pulse amplitude modulation 2 (PAM2) signaling or non-return-to-zero (NRZ) signaling) and output the set of data using the selected modulation scheme. For example, the use of PAM4 signaling to output the data to the host device in conjunction with the prefetch of data from both the master die and the slave die may support a prefetch operation that provides, in response to the read command, an increased amount of data (e.g., doubled relative to the per-die prefetch size) in the same amount of time without needing an increase in data bus width (pin count), an increase in clock rate, or an adjustment in the per-die prefetch size (which may, for example, avoid a redesign of various related aspects of each memory die).

Features of the disclosure are initially described in the context of a memory system and memory die as described with reference to FIGS. 1 and 2. Features of the disclosure are further described in the context of memory dice stacked within a housing (e.g., semiconductor package), various components of the memory dice supporting combined access operations, and timing diagrams depicting operational aspects of the disclosure as described with reference to FIGS. 3-6. These and other features of the disclosure are further illustrated by and described with reference to an apparatus diagram and flowcharts that relate to stacked memory dice for combined access operations as described with references to FIGS. 7-9.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

In some cases, the memory device 110 may include a first memory die (e.g., memory die 160-*a*) including a first memory array (e.g., memory array 170-*a*) and coupled with a data bus (e.g., DQ channels 190) and a command and address (C/A) bus (e.g., C/A channels 186). In some cases, the memory device 110 may also include a second memory die (e.g., memory die 160-*a*) including a second memory array (e.g., memory array 170-*b*) and coupled with the first memory die. In some cases, the first memory die may be configured to receive, via the C/A bus, a read command for a set of data, prefetch a first subset of the set of data from the first memory array, receive a second subset of the set of data from the second memory die, and output the set of data via the data bus. The second memory die may be coupled with the first memory die such that the first memory die and the second memory die may exchange signals. Such coupling may be by one or more through-silicon vias (TSVs), one or more bond wires, or by other suitable links (including, for example, capacitively- or inductively-coupled links), or by any combination of these or other coupling mechanisms. In some cases, the first memory die may be further configured to receive an indication of a data rate, select, based on the data rate, a modulation scheme from a set that includes at least one multi-level (non-binary, higher-order) signaling scheme (e.g., pulse amplitude modulation 3 (PAM3) or pulse amplitude modulation 4 (PAM4) signaling) and at least one binary signaling scheme (e.g., pulse amplitude modulation 2 (PAM2) or non-return-to-zero (NRZ) signaling), and output the set of data using the selected modulation scheme. Though examples described herein may be described in the context of a device that includes two memory dice 160, any quantity of memory dice 160 are possible, and the modulation scheme used to output the set of data and the fraction of the set of data provided by each of the memory dice 160 may in some cases be adjusted accordingly.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dice (dies). A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

In some cases, the memory device 110 may include a first memory die (e.g., memory die 160-a) that includes a first memory array (e.g., memory array 170-a) along with an input/output (I/O) interface and a command and address (C/A) interface (which may refer inclusively to on-die circuitry configured to support an external I/O bus or external C/A bus). The I/O interface and the C/A bus of the first memory die may be coupled with the external memory controller 105 (e.g., via DQ channels 190 and C/A channels 186 respectively). In some cases, the memory device 110 may also include a second memory die (e.g., memory die 160-b) including a second memory array (e.g., memory array 170-b). The second memory die may also include an I/O interface or C/A interface, but the I/O interface and the C/A interface of the second memory die may be bypassed or otherwise disconnected from external channels 115. In some cases, a local memory controller (e.g., a local memory controller to the first memory die) may be configured to cause the memory device 110 to receive, via the C/A interface of the first memory die, a read command for a set of data, access, in response to the read command, the first memory array to obtain a first subset of the set of data and the second memory array to obtain a second subset of the set of data, and transmit the set of data that includes the first subset and the second subset via the I/O interface of the first memory die.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some cases, channels may be referred to as bus. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a DQ channel 190 may be ×4 (e.g., including four signal paths), ×8 (e.g., including eight signal paths), ×16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (C/A) channels 186. The C/A channels 186 may be configured to communicate commands between the external memory controller 105 and the memory device 110 including control information associated with the commands (e.g., address information). For example, the C/A channel 186 may include a read command with an address of the desired data. In some cases, the C/A channels 186 may be registered on a rising clock signal edge and/or a falling clock signal edge. In some cases, a C/A channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. A CK channel 188 may include any quantity of signal paths. In some cases, the clock signal CK (e.g., a CK t signal and a CK c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The DQ channels 190 may be configured to communicate data and/or control information between the external memory controller 105 and the memory device 110. For example, the DQ channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths. In some cases, the other channels 192 may include one or more chip-select (CS) channels. The CS channels may be configured to carry signals that activate or deactivate one or more memory dice. In some cases, a high state of chip-select signal of the CS channel may correspond to an active status of the memory die receiving the chip-select signal.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 or a PAM4 signal) may be a signal that is modulated using a modulation scheme that includes at least three levels to encode more than one bit of information. Multi-symbol modulation schemes and symbols may alternatively be referred to as non-binary, multi-bit, multi-level, or higher-order modulation schemes and symbols.

Figure 2:
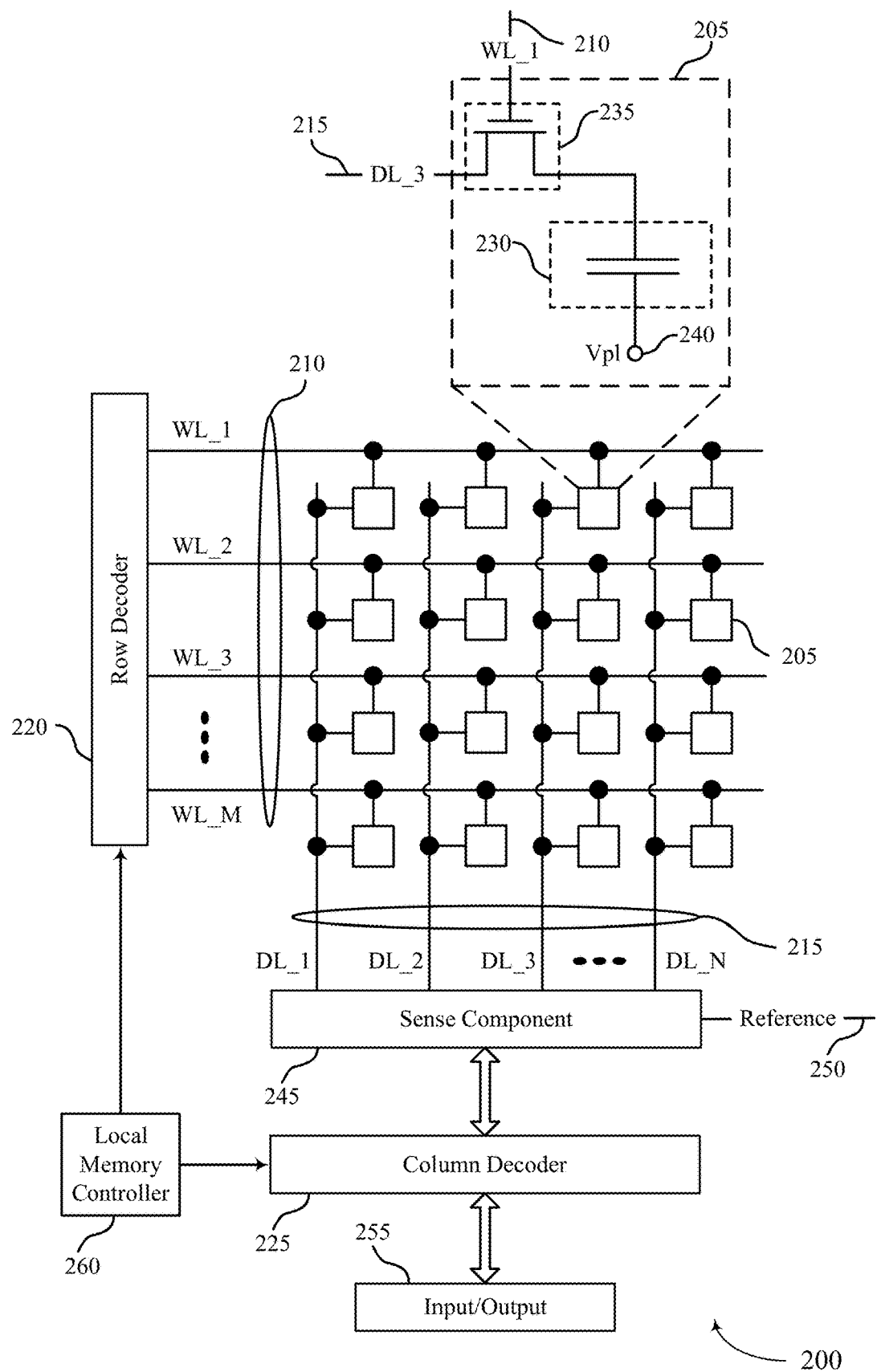
FIG. 2 illustrates an example of a memory die that supports stacked memory dice for combined access operations in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL N, where M and N depend on the size of the memory array. Thus, by activating a word line 210 and a digit line 215, e.g., WL_1 and DL 3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 260 (e.g. local to a first die of a memory device) may receive a read command from a host device, perform, in response to the read command, a prefetch operation for a set of data that includes a first subset stored in the first die and a second subset stored in a second die (not shown) also included in the memory device, and transmit the set of data to the host device. In some cases, the local memory controller 260 may receive an indication of a data rate and select, based on the data rate, a modulation scheme from a set that includes a non-binary modulation scheme (e.g., pulse amplitude modulation 3 (PAM3) or pulse amplitude modulation 4 (PAM4) signaling) and a binary modulation scheme (e.g., pulse amplitude modulation 2 (PAM2) or non-return-to-zero (NRZ) signaling). In some cases, the local memory controller may output the set of data using the selected modulation scheme.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
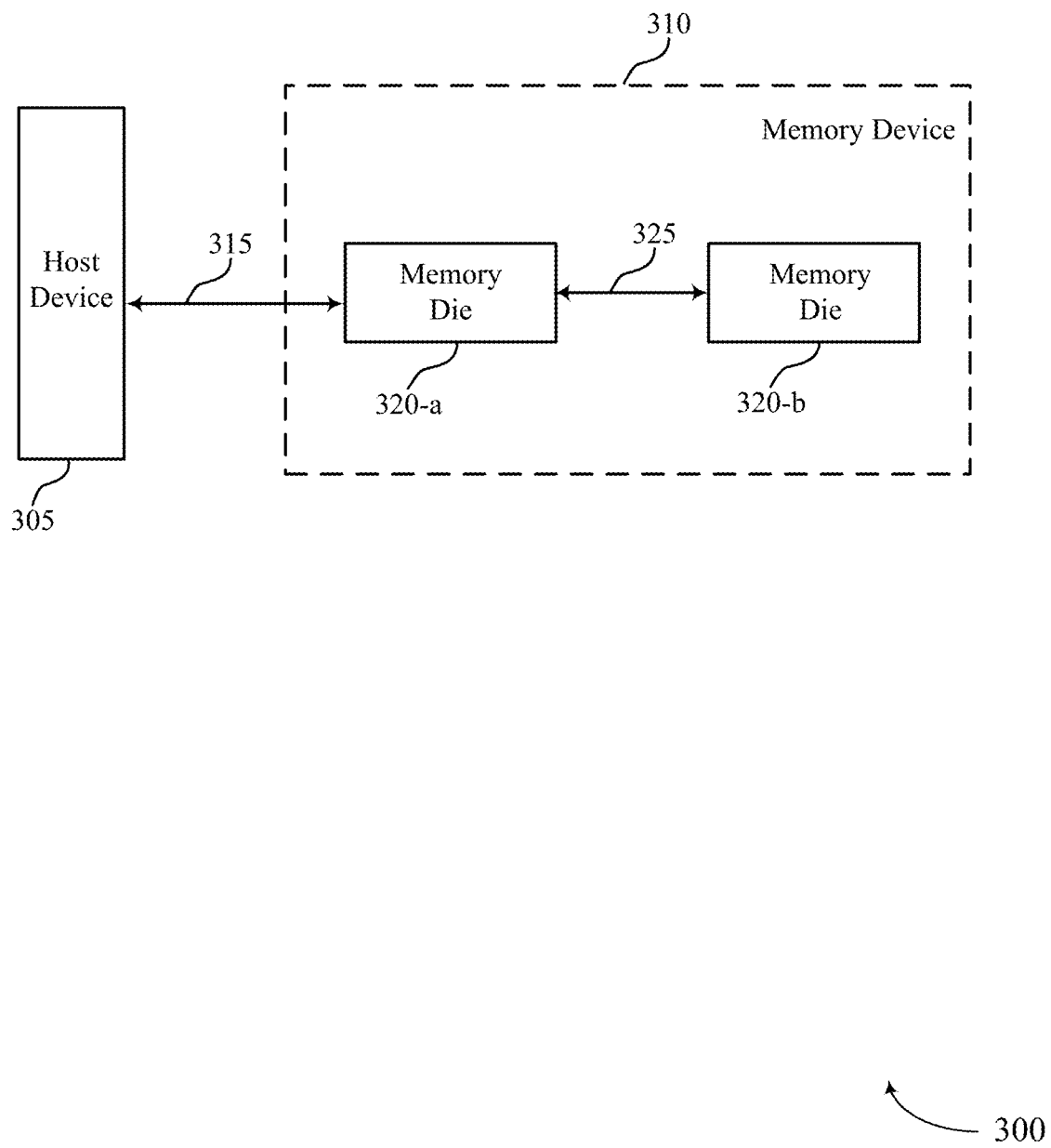
FIG. 3 illustrates an example of a system that supports stacked memory dice for combined access operations in accordance with examples as disclosed herein.

FIG. 3 illustrates an example of a system 300 that supports stacked memory dice for combined access operations in accordance with examples as disclosed herein. The system 300 illustrates an example of a system that includes a memory device including stacked memory dice for combined access operations. The system 300 may include a host device 305 (which may be an example of the external memory controller 105 described with reference to FIG. 1) and a memory device 310 (which may be an example of memory device 110 described with reference to FIG. 1). The memory device 310 may be coupled with a bus 315 (which may be an example of channel 115 described with reference to FIG. 1). The bus 315 may be referred to as a link or a host link. In some cases, the bus 315 may be referred to as an external bus (e.g., external to the memory device 310). In some cases, the bus 315 may include a data bus (e.g., a DQ bus) and a command and address (C/A) bus.

The memory device 310 may include two or more memory dice (e.g., a first memory die 320-a, a second memory die 320-b). In some cases, the two or more memory dice may be stacked on top of each other and the stacked memory dice may be located above a substrate (e.g., a ball-grid-array (BGA) substrate). The first memory die 320-a may be coupled with the host device 305 via the bus 315. The first memory die 320-a may be further coupled with the second memory die 320-b via a bus 325. In some cases, the bus 325 may be referred to as an internal bus (e.g., internal within the memory device 310). In some cases, the second memory die 320-b may be configured to provide data to the first memory die 320-a and may not be coupled with the host device 305 (other than indirectly, via the first memory die 320-a). Within the context of a memory system or sub-system, the first memory die 320-a may be referred to as a master die and the second memory die 320-b may be referred to as a slave die within a master/slave architecture.

In some cases, the system 300 may be an example of a multi-chip package system where the host device 305 in a first package is coupled with the memory device 310 in a second package via the bus 315. In some cases, the bus 315 may include a quantity of pins (e.g., a pin count) supporting a desired bandwidth (e.g., an amount of data transferred in a unit of time, data transfer rate, data rate) between the host device 305 and the memory device 310. In some cases, an increase in a system clock speed (e.g., CK described with reference to FIG. 1) may increase the bandwidth of the system 300. But the increase in clock speed may increase power consumption that may be unsuitable for a mobile system or have other drawbacks. Additionally or alternatively, an increase in the pin count (e.g., increase in a quantity of I/O pins) may increase the bandwidth of the system 300. But such an increase in pin count may result in greater package sizes (e.g., greater package size of the host device 305, greater package size of the memory device 310), which in turn, may increase complexity and cost of the multi-chip package system, or have other drawbacks. Such increase in the cost may be unsuitable for a cost-sensitive mobile system or other systems.

In some cases, the memory device 310 may include multiple memory dice to increase a storage capacity (e.g., density). The multiple memory dice may be stacked on top of each other to avoid significant increase in a footprint of the memory device 310. In some cases, the multiple memory dice may be configured in accordance with a master/slave configuration. In some cases, each of the multiple memory dice within the master/slave configuration may be configured to provide data to the host device 305 (e.g., via bus 315 without increasing a pin count or I/O loading). In some such cases, the multiple memory dice may be considered to be associated with multiple ranks that may be configured to provide the increased storage capacity using an interleaved accesses among the multiple dice with multiple ranks. Accessing different memory dice with different ranks may result in a time delay (e.g., a time bubble) between accessing a first memory die with a first rank and a second memory die with a second rank—e.g., due to separate clock signal synchronization that needs to be performed on each memory die. Such a time delay may impose rank-to-rank turnaround timing restrictions on the multiple memory dice, which may reduce a bandwidth efficiency of the system 300.

In some cases, using a higher-order, non-binary modulation scheme (e.g., a pulse amplitude modulation 3 (PAM3) or a pulse amplitude modulation 4 (PAM4) scheme in which each symbol may represent two bits of information) to transmit data between the host device 305 and the memory device 310 may increase a bandwidth of the system 300. Applying a PAM4 or other non-binary modulation scheme to a legacy memory die, however, may necessitate a change in prefetch size of a memory array within the legacy memory die (e.g., doubling a prefetch size from 32 bytes (32B, 256 bits) to 64 bytes (64B, 512 bits)) and result in a major design and layout change, which in turn, may lead to an increased size of the legacy memory die. In some cases, such an increase in the prefetch size may lead to an increase in a minimum access length (e.g., from 32B to 64B) that may result in an inefficient energy consumption—e.g., the memory device 310 producing 64B of data when the host device 305 needs 32B of data, or the memory device 310 being restricted to producing 32B of data when the memory device 310 is capable of producing 64B of data. As such, a flexible capability of a memory die without having to incur a major design modification may be desired where the memory die may switch among various modulation schemes (e.g., PAM4 scheme, non-return-to-zero (NRZ) scheme) and support a minimal burst length specified to support certain applications—e.g., a 32 bytes (32B) minimum access length (MAL) for a mobile system.

In accordance with the teachings described herein, stacked or other arrangements of multiple memory dice for combined access operations may provide an increased bandwidth without increasing the system clock speed or the quantity of pins between the host device 305 and the memory device 310—e.g., an increased bandwidth per I/O pin. The stacked memory dice for combined access operations may also provide the increased storage capacity without compromising the bandwidth efficiency unlike certain master/slave memory configurations that include multiple ranks of memory dice. Further, each memory die of the stacked memory dice for combined access operations may be configured to support a certain size of MAL (e.g., 32B MAL for a mobile system applications) and multiple modulation schemes (e.g., PAM4 scheme, NRZ scheme).

In some cases, the memory device 310 include a first memory die 320-*a* that may be configured to receive a read command from the host device 305 via the bus 315 (e.g., C/A bus). In some cases, the first memory die 320-*a* may be referred to as a master die as in a master/slave configuration. The first memory die 320-*a* may supply first data via the bus 315 (e.g., data bus) for a first portion of a prefetch operation to the host device 305 based on receiving the read command. The first data may have been stored in the first memory die 320-*a*. The memory device 310 includes a second memory die 320-*b* that may be configured to supply, to the first memory die 320-*a* based on the read command, second data for a second portion of the prefetch operation. In some cases, the second memory die 320-*b* may be referred to as a slave die as in the master/slave configuration. As depicted in the system 300, the second memory die 320-*b* may be configured to support the host device 305 through the first memory die 320-*a* (master die). As such, the system 300 may be configured as a single-rank memory system and may mitigate certain issues associated with a multiple-rank memory system (e.g., rank-to-rank turnaround timing restrictions). The second data may have been stored in the second memory die 320-*b*.

Additionally, the first memory die 320-*a* may be configured to receive the second data for the second portion of the prefetch operation from the second memory die 320-*b*. In some cases, the first memory die 320-*a* may obtain the second data from the second memory die 320-*b* concurrently with accessing at least a portion of the first data such that some latency associated with accessing the second memory die 320-*b* may be mitigated (e.g., hidden from the host device 305). In some cases, the first memory die 320-*a* may output the first data over a first set of unit intervals (UIs) and the second data over a second set of UIs that is immediately subsequent to the first set of UIs—e.g., without any time delay or time bubble between the first data and the second data, such that the first UI in which symbols representing the second data are conveyed is immediately subsequent to the last UI in which symbols representing the first data are conveyed.

Further, the first memory die 320-*a* may include an input/output (I/O) interface that may be coupled with the bus 315 (e.g., data bus) such that the first memory die 320-*a* may output, over the bus 315 to the host device 305, the second data for the second portion of the prefetch operation after the first data for the first portion of the prefetch operation. In some cases, the I/O interface may be configured to switch between binary signaling (e.g., NRZ scheme) and multi-level signaling (e.g., PAM4 scheme) over the bus 315 (e.g., data bus). The first memory die 320-*a* may be configured to receive, from the host device 305, an indication to use the multi-level signaling (e.g., PAM4 scheme) to output the first data for the first portion of the prefetch operation and the second data for the second portion of the prefetch operation using the multi-level signaling (e.g., PAM4 scheme). In some cases, such an indication may include a data transfer rate associate with the read command—e.g., using PAM4 scheme when the data transfer rate is greater than 6.4 giga-bits per second (Gbps), using NRZ scheme when the data transfer rate is less than or equal to 6.4 Gbps.

In some cases, the I/O interface of the first memory die 320-a may include a first I/O interface and a second I/O interface, where the first I/O interface and the second I/O interface may be selectively configurable to operate as a single I/O interface or as independent I/O interfaces. For example, the first I/O interface may be configured to operate as a first ×8 I/O interface (e.g., an interface having eight (8) bits operating in parallel) and the second I/O interface as a second ×8 I/O interface. The first ×8 I/O interface and the second ×8 I/O interface may operate independent of each other. In some cases, the first ×8 I/O interface may be coupled with a first data bus and the second ×8 I/O interface may be coupled with a second data bus, where the data bus may include the first data bus and the second data bus. Additionally or alternatively, the first I/O interface and the second I/O interface may be configured to operate as a single ×16 I/O interface (e.g., a single interface having sixteen (16) bits operating in parallel) that may be coupled with the data bus.

Further, the first I/O interface and the second I/O interface may be configured to switch between binary signaling (e.g., NRZ scheme) and multi-level signaling (e.g., PAM4 scheme) over the bus 315 (e.g., data bus). In some cases, the first memory die 320-a may be configured to determine whether to operate the first I/O interface and the second I/O interface as the single I/O interface (e.g., single ×16 I/O interface) or as independent I/O interfaces (e.g., two (2)×8 I/O interfaces) based on configuration information. In some cases, such a configuration may affect addressing scheme of the system 300 and may be established no later than a power-up time of the system 300 and stored in a mode register for the memory device 310 (e.g., within the first memory die 320-a in some cases).

The first I/O interface and the second I/O interface each operating as ×8 I/O interface may be referred to as ×8 pseudo-channel. In some cases, the ×8 pseudo-channels may facilitate the memory device 310 selectively operating to support a 32B MAL for certain applications—e.g., legacy mobile applications. For example, during the ×8 pseudo-channels operations, one or more pins (as part of the C/A bus) may be designated with one or more indications directed to control either the first I/O interface, the second I/O interface, or both. The one or more pins may be considered to perform similar to a chip-select pin (CS pin), in some cases. For instance, one pin (e.g., first CS pin) as part of the CA bus may be designated to control (e.g., activate, deactivate) the first I/O interface (e.g., first one of the two ×8 pseudo-channels). Additionally or alternatively, another pin (e.g., second CS pin) as part of the CA bus may be designated to control (e.g., activate, deactivate) the second I/O interface (e.g., second one of the two ×8 pseudo-channels). In this manner, the one or more pins (e.g., first CS pin, second CS pin) may facilitate issuing separate addresses for the first I/O interface and the second I/O interface.

In some cases, each I/O interface operating as the ×8 pseudo-channel may be configured to output eight (8) bits of information over thirty-two (32) bursts (e.g., BL32) in response to a read command from the host device 305. As such, the first I/O interface or the second I/O interface (e.g., each ×8 pseudo-channel) may support the 32B MAL with a byte mode (e.g., ×8 mode) that a legacy mobile application may operate with. In some cases, both ×8 pseudo-channels may operate concurrently and independent of each other—e.g., outputting at least a portion of a first 32 bytes of data (e.g., first 32 bytes of data corresponding to 32B MAL) via the first data bus concurrent with outputting at least a portion of a second 32 bytes of data (e.g., second 32 bytes of data corresponding to 32B MAL) via the second data bus.

Figure 4:
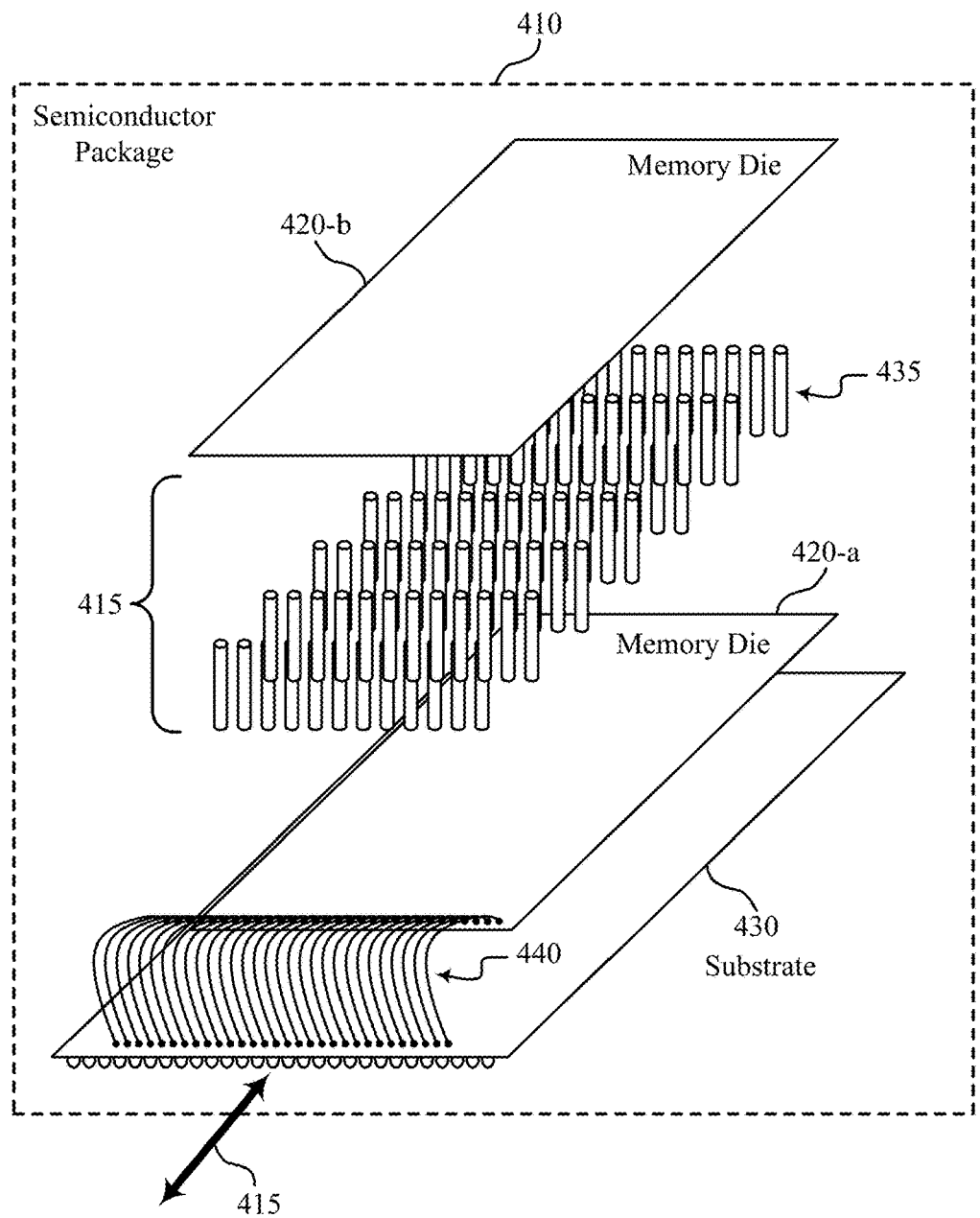
FIG. 4 illustrates an example diagram of a system that supports stacked memory dice for combined access operations in accordance with examples as disclosed herein.

FIG. 4 illustrates an example diagram 400 of a system that supports stacked memory dice for combined access operations in accordance with examples as disclosed herein. The diagram 400 includes a portion of the system 300 described with reference to FIG. 3. The diagram 400 depicts a memory device 410 (which may be an example of the memory device 310 described with reference to FIG. 3) that may be configured to couple with a bus 415 (which may be an example of the bus 315 described with reference to FIG. 3). By way of example, the memory device 410 may include two stacked memory dice—a first memory die 420-a (which may be an example of the first memory die 320-a described with reference to FIG. 3) and a second memory die 420-b (which may be an example of the second memory die 320-b described with reference to FIG. 3) but the stacked memory dice for combined access operations described herein may support any quantity of memory dice (e.g., three memory dice, four memory dice, eight memory dice).

In some cases, the first memory die 420-a may be referred to as a master die and the second memory die 420-b may be referred to as a slave die in a master/slave architecture of a memory system. It should be noted that the second memory die 420-b (e.g., the slave die) is coupled with the first memory die 420-a (e.g., the master die) without having a connection to the host device (e.g., no host I/O connection). As such, the second memory die 420-b may provide data to the first memory die 420-a such that the stacked memory dice including the first memory die 420-a and the second memory die 420-b may operate as a single rank memory device while providing an increased storage capacity. In some cases, one or more aspects of the first memory die 420-a and the second memory die 420-b may include an identical design. For example, both the first memory die 420-a and the second memory die 420-b may include master/slave logic circuitry and the second memory die 420-b may function as a master die and the first memory die 420-a may function as a slave die. In other words, a same design for memory dice may be used to mass-produce the memory dice and any one of the memory dice may be assembled to become a master die or a slave die to be included within the memory device 405. In some cases, the second memory die 420-b may be modified relative to the first memory die 420-a in order to route data and commands between the two memory dice 420 while bypassing an I/O interface, a C/A interface, or other circuitry included in the second memory die 420-b. Further, in some cases, the master/slave logic included in each memory dice 420 may differ between the first memory die 420-a and the second memory die 420-b so as to configure the first memory die 420-a as the master die and the second memory die 420-b as the slave die. Also, in some cases, the first memory die 420-a may include buffer circuitry (separate from or included in the I/O interface), such as first-in-first-out (FIFO) circuitry, to accommodate handling data received from the second memory die 420-b, and the second memory die 420-b may or may not include like buffer circuitry.

In some cases, a bus 415 (which may be an example of the bus 315 described with reference to FIG. 3) may couple the second memory die 420-*b* with the first memory die 320-*a*. In some cases, the bus 415 may include one or more through-silicon vias 435 (TSVs), or one or more bond wires, or both. In some cases, the bus 415 may additionally or alternatively include other types of communicative links, such as capacitively- or inductively-coupled links. In some cases, the bus 415 (e.g., TSVs 435) may transfer various control signals (e.g., control signals received by the first memory die 420-*a* over the C/A bus as described with reference to FIG. 3), data (e.g., data to be transmitted by the first memory die 420-*a* over the data bus as described with reference to FIG. 3), and power signals between the first memory die 420-*a* and the second memory die 420-*b*.

In some cases, the memory device 410 includes a substrate 430, above which the stacked memory dice may be positioned. In some cases, the stacked memory dice and the substrate 430 of the memory device 410 may be placed within a semiconductor package (e.g., a housing). In some cases, the substrate 430 may include a ball-grid array (e.g., BGA substrate) that includes an array of balls configured to connect the semiconductor package to nodes of a printed-circuit board (PCB) on which a host device (e.g., the host device 305 described with reference to FIG. 3) may be positioned. The first memory die 420-*a* may be coupled with the substrate 430 using one or more bond wires 440. The bond wires 440 may be configured to connect one or more bond pads of the first memory die 420-*a* to one or more pins of the semiconductor package (e.g., balls of the BGA substrate) that includes the memory device 410. The bond wires 440 may transfer various control signals (e.g., control signals received by the first memory die 420-*a* over the C/A bus), data (e.g., data to be transmitted by the first memory die 420-*a* over the data bus), and power signals between the first memory die 420-*a* and the pins (e.g., balls of the BGA substrate) of the semiconductor package. The pins of semiconductor package may couple the semiconductor package (e.g., the memory device 410) with various components positioned on the PCB—e.g., the host device.

Figure 5:
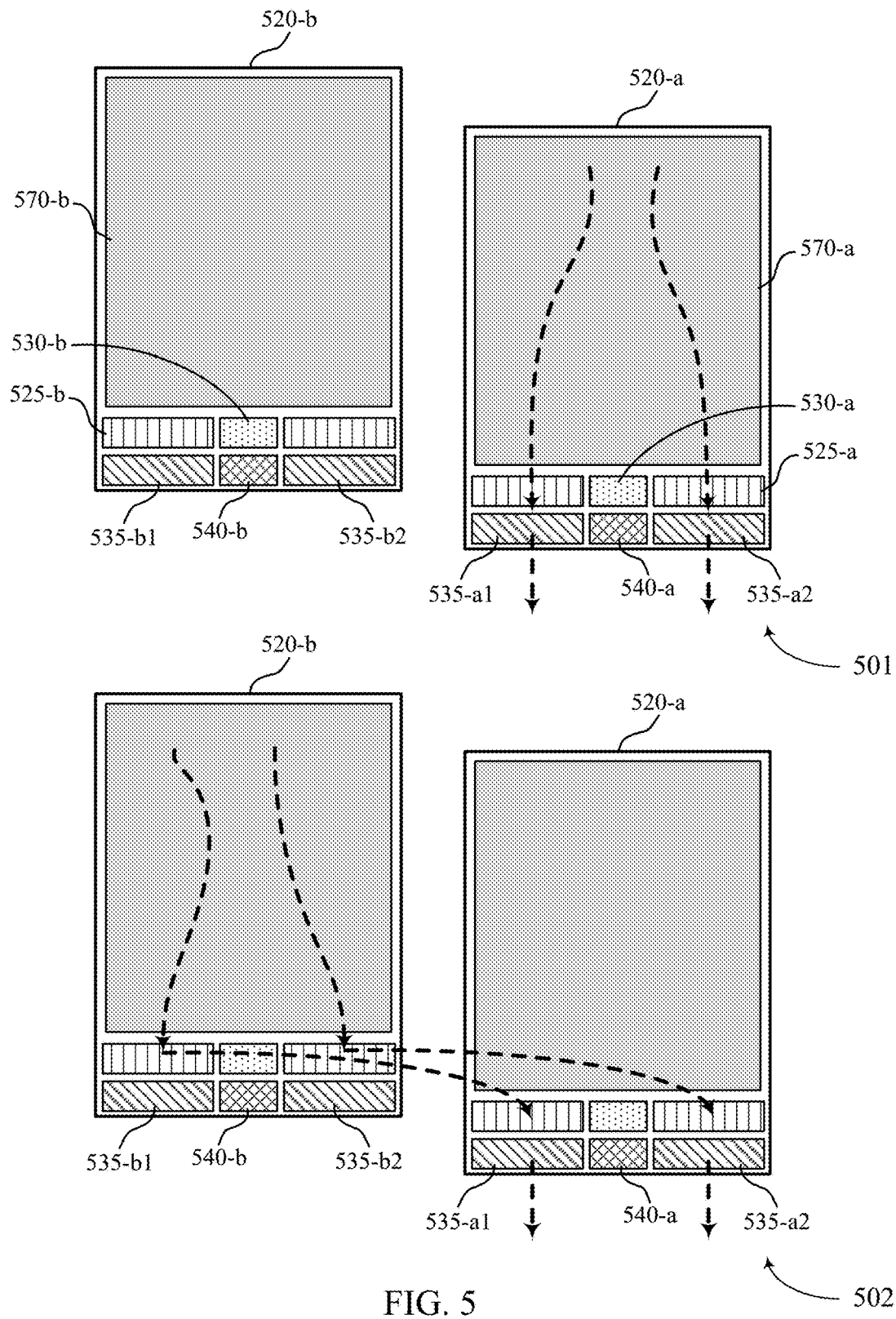
FIG. 5 illustrates examples of diagrams of stacked memory dice for combined access operations in accordance with examples as disclosed herein.

FIG. 5 illustrates examples of diagrams 501 and 502 of stacked memory dice for combined access operations in accordance with examples as disclosed herein. By way of example, each diagram depicts two memory dice—e.g., first memory die 520-*a* (which may be an example of the first memory die 420-*a* described with reference to FIG. 4), second memory die 520-*b* (which may be an example of the second memory die 420-*b* described with reference to FIG. 4). In some cases, the first memory die 520-*a* may be referred to as a master die and the second memory die 520-*b* may be referred to as a slave die. Although FIG. 5 depicts the memory dice side-by-side in an effort to increase the visibility and clarity of the depicted features, the second memory die 520-*b* may be coupled with the first memory die 520-*a* using one or more TSVs (or one or more bond wires or other types of links)—e.g., the second memory die 520-*b* stacked above the first memory die 520-*a* as described with reference to FIG. 4. Further, the stacked memory dice may be located above a substrate (e.g., BGA substrate) and a master die (e.g., the first memory die 520-*a*) of the stacked memory dice may be coupled with the substrate using one or more bond wires—e.g., one or more bond wires connecting one or more bond pads of the first memory die 520-*a* to one or more pins associated with the substrate (e.g., array of balls of the BGA substrate). In some cases, a semiconductor package (e.g., a housing) may include the stacked memory dice and the substrate such that pins of the semiconductor package (e.g., array of balls of the BGA substrate) may couple the stacked memory dice with a host device.

Each memory die (e.g., first memory die 520-*a*, second memory die 520-*b*) may include a memory array 570 (which may be an example of memory array 170 descried with reference to FIG. 1), master/slave logic circuitry 525, master/slave C/A interface 530, I/O interface 535, and C/A interface 540. In some cases, the memory dice (e.g., first memory die 520-*a*, second memory die 520-*b*) may include a same design (or layout). Each of these components of the memory die depicted in FIG. 5 may communicate, directly or indirectly, with one another via one or more internal buses (or channels) that are omitted in FIG. 5 to improve clarity of illustrating the components.

The memory array 570 may include an array of memory cells (e.g., DRAM cells). In some cases, the memory cells may support an industry standard specification (e.g., JEDEC DDR2, DDR3, DDR4, LPDDR2, LPDDR3, LPDDR4, LPDDR5, GDDR4 or GDDR5 specifications, or beyond). In some cases, the memory array 570 may include supporting circuitry for various operations (e.g., read operations, write operations, refresh operations) associated with the memory cells.

The master/slave logic circuitry 525 may be configured to communicate with the memory array 570 and the master/slave C/A interface 530 to support aspects of operations related to the memory die (e.g., first memory die 520-*a*, second memory die 520-*b*) functioning as either a master die or a slave die. For example, a second master/slave logic circuitry 525-*b* of the second memory die 520-*b* (e.g., slave die) may control data paths associated with a set of data prefetched from the second memory array 570-*b* such that the set of data may be diverted (e.g., routed) to the first master/slave logic circuitry 525-*a* of the first memory die 520-*a* (e.g., master die) during a read operation. In some cases, the master/slave logic circuitry 525 may be associated with one or more TSVs (or, additionally or alternatively, other types of communicative links, such as capacitively- or inductively-coupled links) that couple the first memory die 520-*a* (e.g., master die) with the second memory die 520-*b* (e.g., slave die). In some cases, each TSV may be configured to support one (1) byte of data.

The master/slave C/A interface 530 may be configured to communicate with the master/slave logic circuitry 525 and the C/A interface 540 to communicate control information (e.g., command and address information) related to the memory die (e.g., first memory die 520-*a*, second memory die 520-*b*) operating as either a master die or a slave die. For example, the first master/slave C/A interface 530-*a* of the first memory die 520-*a* (e.g., master die) may provide a first set of addresses associated with a first access operation to prefetch a first set of data from the first memory array 570-*a*. The first set of addresses associated with the first access operation may be based on control information (e.g., command and address information) that the C/A interface 540 may have communicated to the first master/slave C/A interface 530-*a*. Additionally or alternatively, the first master/slave C/A interface 530-*a* may, in conjunction with the second master/slave C/A interface 530-*b* of the second memory die 520-*b* (e.g., slave die), provide a second set of addresses associated with a second access operation to prefetch a second set of data from the second memory array 570-*b*.

The I/O interface 535 may be configured to communicate with the host device, the master/slave logic circuitry 525, and the C/A interface 540. The I/O interface 535 may be coupled with a bus configured to carry signals associated with transmitting data (e.g., data bus) between the host device and the stacked memory dice. The I/O interface 535 may be configured to support a first modulation scheme that may include three or more voltage levels (e.g., PAM4 scheme) in addition to a second modulation scheme that may include two voltage levels (e.g., NRZ scheme) to generate the signals associated with transmitting data. In some cases, the I/O interface 535 may include circuitry that may generate signals (e.g., PAM4 signals in accordance with PAM4 scheme, NRZ signals in accordance with NRZ scheme) such as first-in-first-out (FIFO) circuitry, serializer/deserializer circuitry, etc. In some cases, the I/O interface 535 may be configured to operate as a byte-mode I/O interface (e.g., ×8 I/O interface, an interface having eight (8) bits operating in parallel).

As an illustrative example, the memory die (e.g., first memory die 520-*a*, second memory die 520-*b*) may include two (2) I/O interfaces 535 (e.g., first I/O interface 535-*a*1 and second I/O interface 535-*a*2 within the first memory die 520-*a*). In some cases, the first I/O interfaces 535-*a*1 may be coupled with a first bus (e.g., first data bus) and the second I/O interfaces 535-*a*2 may be coupled with a second bus (e.g., second data bus), where the bus includes the first bus and the second bus. In some cases, both I/O interfaces may be configured to operate in the byte mode (e.g., ×8 mode I/O interface). In such cases, the first I/O interface 535-*a*1 and the second I/O interface 535-*a*2 may operate as a single I/O interface (e.g., ×16 mode I/O interface) or as two (2) independent I/O interfaces (e.g., two ×8 mode I/O interfaces). In some cases, the I/O interfaces 535 of a slave die (e.g., first I/O interface 535-*b*1 and second I/O interface 535-*b*2 within the second memory die 520-*b*) may be bypassed (e.g., not used) during the read operation.

The C/A interface 540 may be configured to communicate with the host device, the master/slave C/A interface 530, the I/O interfaces 535. The C/A interface 540 may be coupled with a bus configured to carry signals associated with control information (e.g., command and address information)—e.g., C/A bus. In some cases, the C/A interface 540-*a* of the first memory die 520-*a* (e.g., master die) may be configured to receive, via the C/A bus, a read command for a set of data from the host device. In some cases, the C/A interface 540-*b* of the second memory die 520-*b* (e.g., slave die) may be bypassed (e.g., not used) during the read operation.

Still referring to FIG. 5, the diagrams 501 and 502 also illustrate data paths (arrows with broken lines) during combined access operations in response to a read command for a set of data. The read command may have been received by the C/A interface 540-*a* of the first memory die 520-*a* (e.g., master die) from the host device via the C/A bus. The diagram 501 may depict data paths during a first half of a data burst associated with a read command—e.g., during a first set of unit intervals (UIs) including UI_0 through UI_7 when the data burst includes a total of sixteen (16) UIs, UI_0 through UI_15. Similarly, the diagram 502 may depict data paths during a second half of the data burst associated with the read command—e.g., during a second set of unit intervals (UIs) including UI_8 through UI_15.

Referring to the diagram 501, the first memory die 520-*a* may prefetch a first subset of data from the first memory array 570-*a* to provide the first subset of data to the I/O interfaces 535-*a*1 and 535-*a*2. The I/O interfaces 535-*a*1 and 535-*a*2 may generate a first set of signals in accordance with a modulation scheme (e.g., PAM4 scheme, NRZ scheme). In some cases, the first memory die 520-*a* (e.g., master die) may receive an indication of a data rate associated with the read command (e.g., 3.2 Gbps, 6.4 Gbps, 12.8 Gbps) and select the modulation scheme based on the indication of the date rate. Subsequently, the I/O interfaces 535-*a*1 and 535-*a*2 may transmit the first set of signals (e.g., the first subset of data) over the data bus to the host device, which may correspond to the first half of a data burst associated with the read command—e.g., during the first set of unit intervals (UIs) including UI_0 through UI_7.

Referring to the diagram 502, the second memory die 520-*b* (e.g., slave die) may prefetch a second subset of data from the second memory array 570-*b* to provide the second subset of data to the first memory die 520-*a* (e.g., master die). In some cases, the second memory die 520-*b* (e.g., the master/slave logic circuitry 525-*b* within the slave die) may divert the second subset of data to the first memory die 520-*a* (e.g., the master/slave logic circuitry 525-*a* within the master die). As such, the C/A interface 540-*b* and the I/O interface 535-*b* within the second memory die 520-*b* (e.g., slave die) may be bypassed (e.g., not used) to output the second subset of data to the host device. The first memory die 520-*a* (e.g., master die), upon receiving the second subset of data from the second memory die 520-*b* (e.g., slave die), may generate a second set of signals in accordance with the selected modulation scheme (e.g., PAM4 scheme, NRZ scheme) and transmit the second set of signals (e.g., the second subset of data) over the data bus to the host device, which may correspond to the second half of a data burst associated with the read command—e.g., during the second set of unit intervals (UIs) including UI_8 through UI_15.

In some cases, the first memory die 520-*a* (e.g., master die) may obtain the second subset of data from the second memory die 520-*b* (e.g., slave die) concurrently with accessing at least a portion of the first subset of data from the first memory array 570-*a*. As such, at least some latency associated with prefetching the second subset of data from the second memory array 570-*b* may be screened (e.g., hidden) from the host device's point of view. In some cases, the first memory die 520-*a* (e.g., master die) may output the first subset of data over the first set of UIs (e.g., UI_0 through UI_7) and the second subset of data over a second set of UIs (e.g., UI_8 through UI_15) that may be immediately subsequent to the first set of UIs—e.g., no time delay or time bubble between the first set of UIs and the second set of UIs. In this manner—e.g., the master die (e.g., the first memory die 520-*a*) interfacing with the host device and obtaining the second subset of data from the slave die (e.g., the first memory die 520-*a*) concurrently with accessing the first subset of data, the stacked memory dice for combined access operations may operate with a memory device with a single rank and avoid issues associated with other memory devices with multiple ranks—e.g., rank-to-rank turnaround timing restrictions.

An apparatus is described. In some cases, the apparatus (e.g., the memory device 310 or the memory device 410 described with reference to FIGS. 3 and 4) may include a first memory die (e.g., master die, the first memory die 520-*a*) including a first memory array (e.g., the first memory array 570-*a*) and coupled with a data bus and a command and address (C/A) bus. The apparatus may also include a second memory die (e.g., slave die, the second memory die 520-*b*) including a second memory array (e.g., the second memory array 570-*b*) and coupled with the first memory die. The first memory die may be configured to receive, via the C/A bus, a read command for a set of data, prefetch a first subset of the set of data from the first memory array, receive a second subset of the set of data from the second memory die, and output the set of data via the data bus.

In some cases, the second memory die may be configured to prefetch the second subset from the second memory array.

In some cases, the first memory die may be further configured to output the first subset before the second subset. In some cases, the first memory die may be further configured to output the first subset over a first set of UIs and the second subset over a second set of UIs that may be immediately subsequent to the first set of UIs. In some cases, the apparatus may further include an I/O interface (e.g., the I/O interface 535-*a*1, the I/O interface 535-*a*2, or both) included in the first memory die and coupled with the data bus, where the I/O interface may be configured to receive the first subset of data from the first memory array and the second subset of data from the second memory array. In some cases, the apparatus may further include a second I/O interface (e.g., the I/O interface 535-*b*1, the I/O interface 535-*b*2, or both) included in the second memory die, where the second memory die may be configured to route the second subset of data from the second memory array to the I/O interface via a data path that bypasses the second I/O interface. In some cases, the second I/O interface may be electrically isolated from the second memory array.

In some cases, the apparatus may further include a second I/O interface (e.g., the I/O interface 535-*a*2) included in the first memory die and coupled with a second data bus, where the first memory die may be further configured to receive, via the C/A bus, a second read command for a second set of data, prefetch a first subset of the second set of data (e.g., a first half of the second set of data) from the first memory array, receive a second subset of the second set of data (e.g., a second half of the second set of data) from the second memory die, and output the second set of data via a second data bus. In other words, the I/O interface (e.g., the I/O interface 535-*a*1) and the second I/O interface (e.g., the I/O interface 535-*a*2) included in the first memory die (e.g., master die), each may be configured to operate in a byte mode (e.g., ×8 pseudo-channel mode) and the second I/O interface may output the second set of data associated with the second read command using the second data bus (e.g., a portion of the data bus coupled with the second I/O interface, which may be configured to operate in accordance with the byte mode).

In some such cases (e.g., both I/O interfaces 535-*a*1 and 535-*a*2 operating in the byte mode), the first memory die (e.g., master die) may be further configured to output at least a portion of the second set of data (e.g., 32 bytes of data under the byte-mode operation with burst length of 32 (BL32)) via the second data bus (e.g., the portion of data bus coupled with the I/O interface 535-*a*2) concurrent with outputting at least a portion of the set of data (e.g., 32 bytes of data under the byte-mode operation with burst length of 32 (BL32)) via the data bus (e.g., remaining portion of the data bus coupled with the I/O interface 535-*a*1). In some cases, the apparatus may further include one or more pins configured to receive a first indication that the read command may correspond to the I/O interface (e.g., the I/O interface 535-*a*1) and a second indication that the second read command may correspond to the second I/O interface (e.g., the I/O interface 535-*a*2).

In some cases, the first memory die (e.g., master die) may be further configured to selectively operate the I/O interface (e.g., the I/O interface 535-*a*1) and the second I/O interface (e.g., the I/O interface 535-*a*2) as a single I/O interface having a first width (e.g., ×16 mode) or as independent I/O interfaces each having a second width (e.g., ×8 mode) that is narrower than the first width. In some cases, the apparatus may further include a first C/A interface (e.g., the first C/A interface 540-*a*) included in the first memory die and coupled with the C/A bus, where the first C/A interface may be configured to receive the read command, and a second C/A interface (e.g., the second C/A interface 540-*b*) included in the second memory die, where the first memory die may be configured to communicate with the second memory die based on the read command via a signal path (e.g., via one or more TSVs, one or more bond wires, or other types of links as described with reference to FIGS. 3, 4, and 5) that may bypass the second C/A interface.

In some cases, the first memory die may be further configured to receive an indication of a data rate (e.g., greater than 6.4 Gbps, less than or equal to 6.4 Gbps), select, based on the data rate, a modulation scheme from a set that may include non-binary (e.g., pulse amplitude modulation 4 (PAM4)) signaling and binary (e.g., non-return-to-zero (NRZ)) signaling, and output the set of data using the selected modulation scheme. In some cases, the first subset of data may include a first half of the set of data, and the second subset of data may include a second half of the set of data. In some cases, the second memory die may be coupled with the first memory die by one or more through-silicon vias (TSVs), one or more bond wires, other types of communicative links (e.g., capacitively- or inductively-coupled links), or any combination thereof.

In some cases, an apparatus as described herein (e.g., the memory device 310 or the memory device 410 described with reference to FIGS. 3 and 4) may include a first memory die including an input/output (I/O) interface, a command and address (C/A) interface, and a first memory array. The apparatus may also include a second memory die including a second memory array. Further, the apparatus may include circuitry configured to cause the apparatus to receive, via the C/A interface, a read command for a set of data, access, in response to the read command, the first memory array to obtain a first subset of the set of data and the second memory array to obtain a second subset of the set of data, and transmit the set of data that includes the first subset and the second subset via the I/O interface.

In some cases, the apparatus may further include a signaling path from the C/A interface to the second memory array that may bypass a second C/A interface included in the second memory die, where the circuitry may be further configured to route signaling via the signaling path based on the read command, and a data path from the second memory array to the I/O interface that may bypass a second I/O interface included in the second memory die, where the circuitry may be further configured to cause the apparatus to route the second subset via the data path.

In some cases, the circuitry may be further configured to cause the apparatus to determine that a data rate for transmitting the set of data via the I/O interface may satisfy a threshold, and configure the I/O interface, based on the data rate satisfying the threshold, in accordance with a pulse amplitude modulation 4 (PAM4) modulation scheme, where transmitting the set of data via the I/O interface may use the PAM4 modulation scheme. In some cases, the first memory die may support prefetching a quantity of data (e.g., 32 bytes), the second memory die supports prefetching the quantity of data (e.g., 32 bytes), and the first subset of data and the second subset of data each equal the quantity of data (e.g., 32 bytes).

Figure 6A:
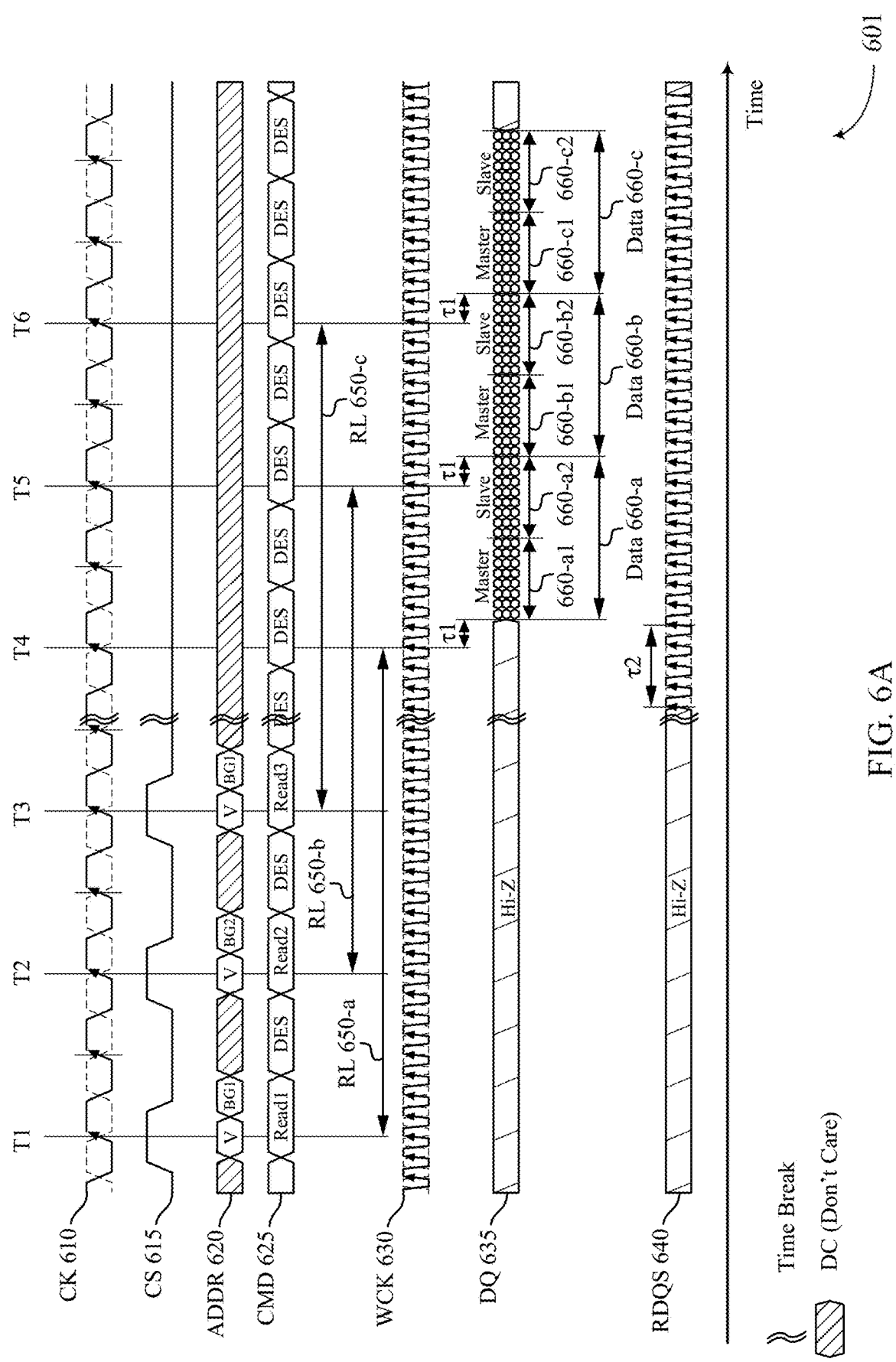
FIGS. 6A and 6B illustrate timing diagrams that support stacked memory dice for combined access operations in accordance with examples as disclosed herein.
Figure 6B:
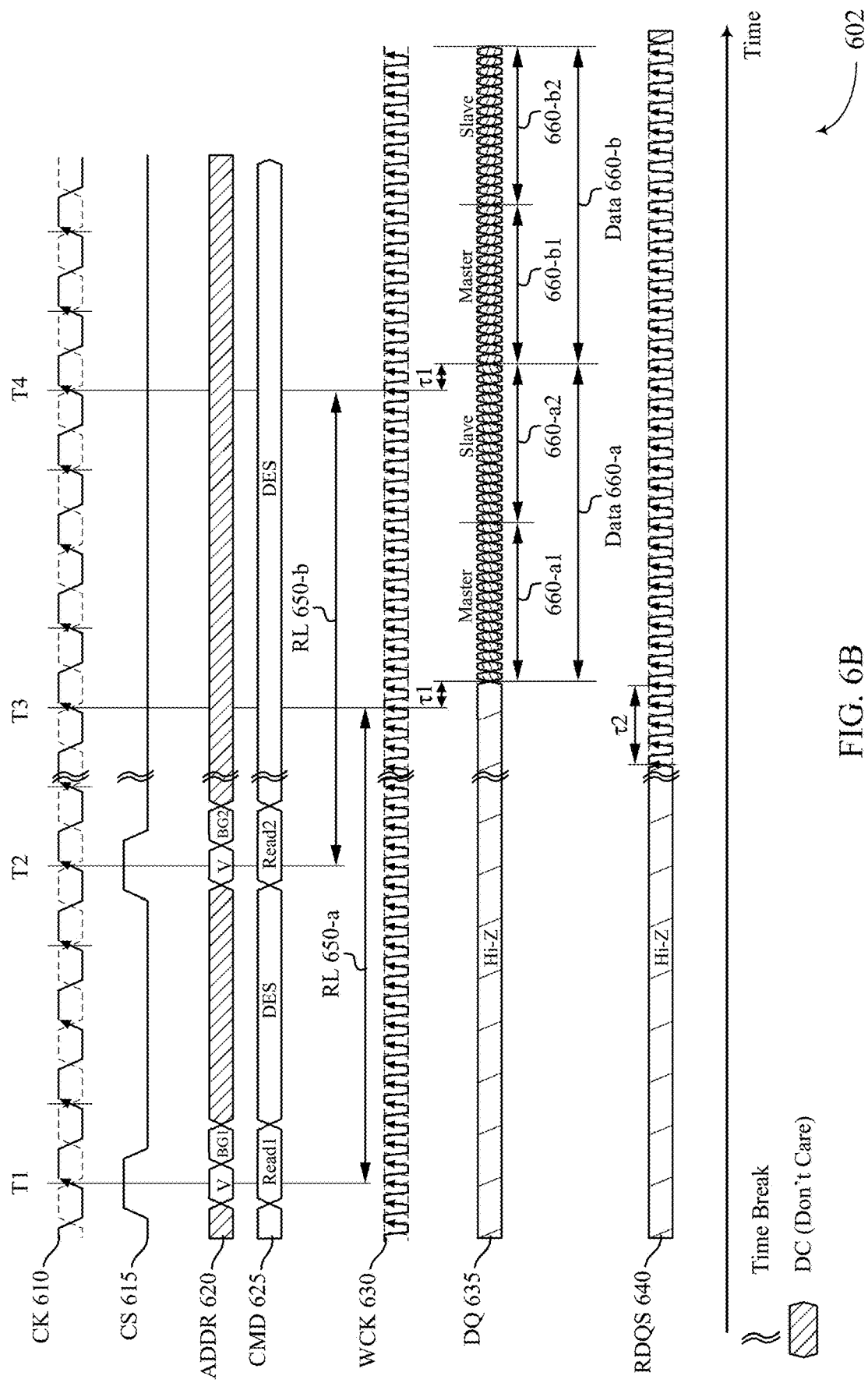

FIGS. 6A and 6B illustrate timing diagrams 601 and 602 that support stacked memory dice for combined access operations in accordance with examples as disclosed herein. The timing diagrams 601 and 602 illustrate various clock signals and signals related to generating a set of data during access operations (e.g., in response to a read command for the set of data). The timing diagram 601 (or the timing diagram 602) illustrates a system clock signal 610 (i.e., CK 610), a chip select signal 615 (i.e., CS 615), an address (ADDR) signal 620 (i.e., ADDR 620), a command (CMD) signal 625 (i.e., CMD 625), a common data clock signal 630 (i.e., WCK 630), a data (DQ) signal 635 (i.e., DQ 635), and a read data strobe (RDQS) signal 640 (i.e., RDQS 640). The timing diagram 601 (or the timing diagram 602) also depicts an arbitrary break in time (i.e., Time Break) to illustrate that some features described herein may not be limited by particular quantities of time duration—e.g., a read latency (i.e., RL 650) may be associated with any quantity of periods of the system clock signal, CK 610. The timing diagram 601 (or the timing diagram 602) may describe aspects of an access operation supported by an external memory controller 105, a device memory controller 155, or a local memory controller 165, or any combination thereof, as described with reference to FIG. 1.

Various signals of the timing diagram 601 (or the timing diagram 602) may be carried by a plurality of channels 115 as described with reference to FIG. 1. In some cases, the CK 610 may be carried by CK channels 188 described with reference to FIG. 1. In some cases, the CS 615 may be carried by other channels 192 described with reference to FIG. 1. In some cases, the ADDR 620 and/or the CMD 625 may be carried by C/A channels 186 described with reference to FIG. 1. In some cases, the WCK 630 may be carried by CK channels 188 described with reference to FIG. 1. In some cases, the DQ 635 may be carried by DQ channels 190 described with reference to FIG. 1. In some cases, the RDQS 640 may be carried by other channels 192 described with reference to FIG. 1.

A memory device (e.g., the memory device 110, the memory die 160, the memory die 200, the memory device 310, the memory device 410) may operate using multiple clock signals (e.g., a system clock signal, a common data clock signal). Such clock signals may be generated by an external component (e.g., external to the memory device), such as a host device or a controller (e.g., an external memory controller 105) of a system (e.g., the system 100, the system 300) that includes the memory device. Further, the memory device may support more than one operational mode such as a low-speed operational mode or a high-speed operational mode, or both. In some cases, various parameters associated with different operational modes (e.g., different operational frequency settings) may be established during a training operation. For example, the memory device coupled with a host device may be trained at set up or at an initialization stage to establish certain conditions for various parameters of the memory device (e.g., parameters controlling driver circuitry, parameters controlling receiver operations, read timing parameters) to achieve different operational frequencies. In some cases, one or more registers may store the parameters associated with the operational frequency settings. Subsequently, the memory device may switch among the different operational frequencies based on the parameters stored in the one or more registers.

The timing diagrams 601 and 602 illustrate various signals during a read operation performed by a system (e.g., the system 300 described with reference to FIG. 3 that includes the memory device 410 or the memory device 500 described with reference to FIGS. 4 and 5) In some cases, such a system may include a first memory die including an input/output (I/O) interface, a command and address (C/A) interface, and a first memory array. The system may also include a second memory die including a second memory array. In some cases, the system may include circuitry configured to cause the system to perform in accordance with the timing diagrams 601 and 602.

The timing diagram 601 illustrate various signals during a read operation performed by the system operating in a PAM4 signaling mode. In some cases, the read operation may be performed at a data rate greater than a threshold (e.g., 6.4 Gbps or greater)—e.g., a high-speed (HS) mode. For example, when the data rate corresponds to 12.8 Gbps, WCK 630 may operate at 3.2 giga Hertz (GHz), which may support an industry standard specification (e.g., a common data clock speed of a JEDEC LPDDR5 specification). In some cases, each read command may return (e.g., output) a total of 32 bytes—e.g., thirty-two (32) bursts (which may be referred to as burst length 32 or BL32) of eight (8) bits per an I/O channel configured to operate in a byte mode (e.g., ×8 mode)—e.g., the first I/O interface 535-$a1$ coupled with a first half of data bus and the second I/O interface 535-$b1$ coupled with a second half of data bus, each operating as an independent I/O interface in the byte mode. In some cases, a master die within the memory device (e.g., the first memory die 520-$a$ described with reference to FIG. 5) may produce first sixteen (16) bytes and a slave die within the memory device (e.g., the second memory die 520-$b$ described with reference to FIG. 5) may produce second sixteen (16) bytes.

The timing diagram 601 illustrates that at time T1, CS 615 correspond to a high state to select (e.g., activate) the memory device (e.g., the master die, the first memory die 520-$a$). CS 615 may facilitate activating or deactivating one or more memory dice (e.g., the first memory die 520-$a$, the second memory die 520-$b$, or both). In some cases, a high state of CS 615 corresponds to an active status of the memory die receiving the CS 615. In some cases, a low state of CS 615 may correspond to a deselect (DES) command of the CMD 625—e.g., the memory cells are deselected. In some cases, CS 615 may activate both I/O interfaces 535 of the master die when I/O interfaces 535 is configured to operate as a single I/O interface (e.g., single ×16 I/O interface). In other cases, there may be two CS 615 each configured to activate I/O interfaces separately (e.g., I/O interface 535-$a1$, I/O interface 535-$a2$) when the I/O interfaces 535 are configured to operate as independent I/O interfaces (e.g., two ×8 I/O interfaces).

At time T1, ADDR 620 corresponds to a valid (V) status indicating the addresses associated with the set of data may be valid. In some cases, ADDR 620 may be referred to as column address signal. ADDR 620 may include bank group information (e.g., BG1, BG2) that immediately follows the V status, where the memory device may operate in a bank group (BG) mode. Hence, the addresses associated with the set of data may correspond to a set of memory cells of a particular bank group (e.g., a first bank group, BG1). Further, CMD 625 correspond to Read1 at time T1 indicating that the master die of the memory device may receive the read command (e.g., Read1) from the host device. In some cases, the C/A interface of the master die (e.g., C/A interface 540-$a$ of the first memory die 520-$a$) may receive CS 615, ADDR 620, and CMD 625 via the C/A bus as described with reference to FIGS. 3 through 5.

At time T4+τ1, the timing diagram 601 illustrates that the master die may output a set of data 660-$a$ using DQ 635 in response to the command Read1 (e.g., CMD 625 at time T1). Further, at time T4+τ1−τ2, RDQS 640 may be activated to strobe the set of data 660-$a$. In some cases, T4 may be associated with a read latency (RL) 650-$a$ and T1 may be associated with a delay between WCK 630 and DQ 635 carrying the set of data 660-*a*. DQ 635 depicts that the set of data 660-*a* may include two subsets of data (e.g., first subset of data 660-*a*1, second subset of data 660-*a*2). In some cases, the master die may prefetch the first subset of data 660-*a*1 from the first memory array (e.g., the memory array 570-*a* within the first memory die 520-*a* (e.g., master die)) and output the first subset of data 660-*a*1 during the first portion of UIs—e.g., during the first eight (8) UIs of a total of sixteen (16) UIs outputting the set of data 660-*a*. Additionally, the master die may obtain the second subset of data 660-*a*2 from the slave die (e.g., the second memory die 520-*b*) and output the second subset of data 660-*a*2 during the second portion of UIs—e.g., during the second eight (8) UIs of the total of sixteen (16) UIs outputting the set of data 660-*a*.

In some cases, transmitting the set of data 660-*a* via the first half of the data bus (e.g., transmitting the set of data 660-*a* through the first I/O interface 535-*a*1 coupled with the first half of data bus) in response to a read command may be complete before transmitting another set of data via the second half of the data bus (e.g., transmitting the another set of data through the second I/O interface 535-*a*2 coupled with the second half of data bus) in response to another read command is complete. In some cases, the master die may obtain the second subset of data (e.g., second subset of data 660-*a*2) from the slave die concurrent with accessing at least a portion of the first subset of data (e.g., first subset of data 660-*a*1). In some cases, the system (e.g., the first memory die 520-*a*, master die) may receive, via a first pin of the master die, a first signal associating the read command with the first half of the data bus (e.g., the first signal controlling the first I/O interface 535-*a*1). Additionally or alternatively, the system (e.g., the first memory die 520-*a*, master die) may receive, via a second pin of the master die, a second signal associating the another read command with the second half of the data bus.

Further, DQ 635 may include four (4) different voltage levels in accordance with the PAM4 signaling mode. Hence, each UI may include two (2) bits of information per pin and the first eight UIs may correspond to 16 bits of information per pin. In some cases, DQ 635 represents an aggregated eight (8) bits of information (e.g., I/O interface 535-*a* operating in the byte mode) and the first eight UIs may correspond to 16 bytes of information. In such cases, the first eight UIs may output 16 bytes of information that may have been prefetched from the first memory array 570-*a* of the first memory die 520-*a* (e.g., master die). Similarly, the second eight UIs may output additional 16 bytes of information that may have been prefetched from the second memory array 570-*b* of the second memory die 520-*b* (e.g., slave die). The second eight UIs may immediately follow the first eight UIs without a time delay because the master die may obtain the second subset of data 660-*a*2 from the slave die concurrently with prefetching the first subset of data 660-*a*1 from the first memory array 570-*a*. The read operation may output the set of data 660-*a* (e.g., 32 bytes) during a total of sixteen (16) UIs under the PAM4 signaling mode.

The timing diagram 601 further illustrates that at time T2, the master die of the memory device may receive another read command (e.g., Read2). DES shown as part of the CMD 625 may include a deselect command to deselect the memory cells of the memory device between Read1 and Read2 commands. The master die may output a second set of data 660-*b* at time T5+τ1 in response to the command Read2. In some cases, the second set of data 660-*b* may be prefetched from a second bank group (e.g., BG2) as indicated in the ADDR 620.

In some cases, the first memory die 520-*a* (e.g., master die) may receive signaling from the host device that may indicate for the master die to switch from the PAM4 signaling mode to the NRZ signaling mode, or vice versa. For example, the master die may determine that a data rate for transmitting the set of data via the I/O interface may meet or exceed a threshold (e.g., 6.4 Gbps) based on receiving the signaling from the host device (e.g., a read command requesting a set of data by specifying a data rate of 12.8 Gbps) and configure the I/O interface in accordance with the PAM4 modulation scheme. Similarly, the master die may determine that the data rate for transmitting the set of data may be less than or equal to the threshold (e.g., 6.4 Gbps) based on receiving the signaling from the host device and configure the I/O interface in accordance with the NRZ modulation scheme. In some cases, the master die may be configured to support a set of modulation schemes that includes a first modulation scheme (e.g., NRZ modulation scheme) in which each symbol represents one bit and a second modulation scheme (e.g., PAM4 modulation scheme) in which each symbol represents two or more bits. Further, the master die may select, based on the data rate, a modulation scheme from the set of modulation scheme and generate symbols for transmitting the set of data over the bus in accordance with the indicated modulation scheme so as to output the set of data using the selected modulation scheme.

The timing diagram 602 illustrates various signals during a read operation performed by the system (e.g., the system 300) operating in an NRZ signaling mode. In some cases, the read operation may be performed at a data rate equal to or less than a threshold (e.g., less than or equal to 6.4. Gbps)—e.g., a low-speed (LS) mode. For example, when the data rate corresponds to 6.4 Gbps, WCK 630 may operate at 3.2 giga Hertz (GHz), which may support an industry standard specification (e.g., a common data clock speed of a JEDEC LPDDR5 specification). In some cases, each read command may return (e.g., output) a total of 32 bytes—e.g., thirty-two (32) bursts (BL32) of eight (8) bits per an I/O channel configured to operate in a byte mode (e.g., ×8 mode). In some cases, a master die within the memory device (e.g., the first memory die 520-*a* described with reference to FIG. 5) may produce first sixteen (16) bytes and a slave die within the memory device (e.g., the second memory die 520-*b* described with reference to FIG. 5) may produce second sixteen (16) bytes.

At time T1, CS 615 correspond to a high state to select (e.g., activate) the memory device (e.g., the master die, the first memory die 520-*a*). Further, ADDR 620 corresponds to a valid (V) status indicating the addresses associated with the set of data may be valid. Additionally, CMD 625 correspond to Read1 at time T1 indicating that the master die of the memory device may receive the read command (e.g., Read1) from the host device.

At time T3+τ1, the timing diagram 602 illustrates that the master die may output a set of data 660-*a* using DQ 635 in response to the command Read1 (e.g., CMD 625 at time T1). Further, at time T3+τ1–τ2, RDQS 640 may be activated to strobe the set of data 660-*a*. In some cases, T3 may be associated with a read latency (RL) 650-*a* and τ1 may be associated with a delay between WCK 630 and DQ 635 carrying the set of data 660-*a*. DQ 635 depicts that the set of data 660-*a* may include two subsets of data (e.g., first subset of data 660-*a*1, second subset of data 660-*a*2). In some cases, the master die may prefetch the first subset of data 660-*a*1 from the first memory array (e.g., the memory array 570-*a* within the first memory die 520-*a* (e.g., master die)) and output the first subset of data 660-*a*1 during the first portion of UIs—e.g., during the first sixteen (16) UIs of a total of thirty-two (32) UIs outputting the set of data 660-*a*. Additionally, the master die may obtain the second subset of data 660-*a*2 from the slave die (e.g., the second memory die 520-*b*) and output the second subset of data 660-*a*2 during the second portion of UIs—e.g., during the second sixteen (16) UIs of the total of thirty-two (32) UIs outputting the set of data 660-*a*.

Further, DQ 635 may include two (2) different voltage levels in accordance with the NRZ signaling mode. Hence, each UI may include one (1) bit of information per pin and the first sixteen (16) UIs may correspond to 16 bits of information per pin. In some cases, DQ 635 represents an aggregated eight (8) bits of information (e.g., I/O interface 535-*a* operating in the byte mode) and the first sixteen UIs may correspond to 16 bytes of information. In such cases, the first sixteen UIs may output 16 bytes of information that may have been prefetched from the first memory array 570-*a* of the first memory die 520-*a* (e.g., master die). Similarly, the second sixteen UIs may output additional 16 bytes of information that may have been prefetched from the second memory array 570-*b* of the second memory die 520-*b* (e.g., slave die). The second sixteen UIs may immediately follow the first sixteen UIs without a time delay because the master die may obtain the second subset of data 660-*a*2 from the slave die concurrently with prefetching the first subset of data 660-*a*1 from the first memory array 570-*a*. The read operation may output the set of data 660-*a* (e.g., 32 bytes) during a total of thirty-two (32) UIs under the PAM4 signaling mode.

The timing diagram 602 further illustrates that at time T2, the master die of the memory device may receive another read command (e.g., Read2). DES shown as part of the CMD 625 may include a deselect command to deselect the memory cells of the memory device between Read1 and Read2 commands. The master die may output a second set of data 660-*b* at time T4+τ1 in response to the command Read2. In some cases, the second set of data 660-*b* may be prefetched from a second bank group (e.g., BG2) as indicated in the ADDR 620.

In some cases, the system (e.g., the system 300) may receive, at the first die (e.g., master die), signaling from the host device that indicates for the first die to switch from the first modulation scheme (e.g., PAM4 modulation scheme) to the second modulation scheme (e.g., NRZ modulation scheme).

Figure 7:
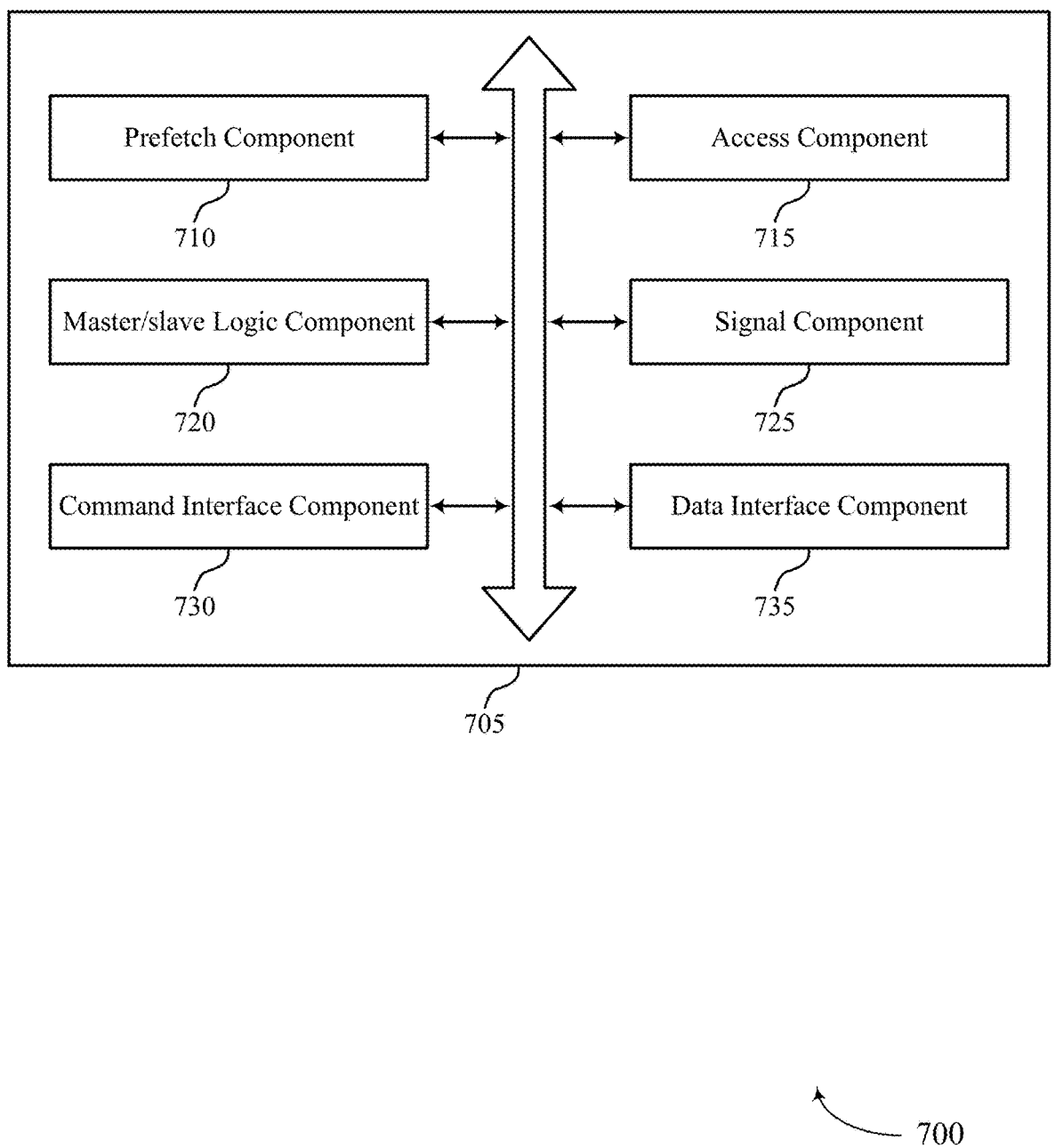
FIG. 7 shows a block diagram of a memory device that supports stacked memory dice for combined access operations in accordance with aspects of the present disclosure.

FIG. 7 shows a block diagram 700 of a memory device 705 that supports stacked memory dice for combined access operations in accordance with examples as disclosed herein. The memory device 705 may be an example of aspects of a memory device as described with reference to FIGS. 1 through 5. The memory device 705 may include a prefetch component 710, an access component 715, a master/slave logic component 720, a signal component 725, a command interface component 730, and a data interface component 735. Each of these modules may communicate, directly or indirectly, with one another (e.g., via one or more buses).

The prefetch component 710 may perform, by the first die of the memory device in response to the read command, a prefetch operation for a set of data that includes a first subset stored in the first die and a second subset stored in a second die included in the memory device. In some examples, the prefetch component 710 may perform, in response to a second read command, a second prefetch operation for a second set of data that includes a respective first subset stored in the first die and a respective second subset stored in the second die. In some examples, the prefetch component 710 may perform, in response to a second read command, a second prefetch operation for a second set of data that includes a respective first subset stored in the first die and a respective second subset stored in the second die.

The access component 715 may access, based on the read command, a first subset of data stored in the first memory array. In some examples, the access component 715 may access, based on the second read command, a corresponding first subset of data stored in the first memory array.

The master/slave logic component 720 may obtain a second subset of data stored in a second memory array by communicating, based on the read command, with a second memory die that is above the substrate and includes the second memory array. In some examples, the master/slave logic component 720 may, based on the second read command, obtain a corresponding second subset of data stored in the second memory array by communicating with the second memory die. In some examples, the master/slave logic component 720 may obtain the second subset of data from the second memory die concurrent with accessing at least a portion of the first subset of data.

The signal component 725 may generate symbols for transmitting the set of data over the bus in accordance with the indicated modulation scheme.

The command interface component 730 may receive, at a first die of a memory device, a read command from a host device. In some examples, the command interface component 730 may receive a read command at a first memory die that is above a substrate and includes a first memory array. In some examples, the command interface component 730 may receive, at the first die, a second read command from the host device.

In some examples, the command interface component 730 may receive, at the first die, signaling from the host device that indicates for the first die to switch from the first modulation scheme to the second modulation scheme. In some examples, the command interface component 730 may receive, at the first die, a second read command from the host device. In some examples, the command interface component 730 may receive the read command and the second read command via a same command and address (C/A) bus.

In some examples, the command interface component 730 may receive, via a first pin of the memory device, a first signal associating the read command with the first half of the data bus. In some examples, the command interface component 730 may receive, via a second pin of the memory device, a second signal associating the second read command with the second half of the data bus.

In some examples, receiving, at the first memory die, an indication of a modulation scheme to use for transmitting the set of data over the bus, the first memory die supporting a set of modulation schemes that includes a first modulation scheme in which each symbol represents one bit and a second modulation scheme in which each symbol represents two or more bits. In some examples, the command interface component 730 may receive, after receiving the read command, a second read command at the first memory die. In some cases, the read command and the second read command are each received at the first memory die via a second bus and correspond to a same burst length (BL).

The data interface component 735 may transmit, by the first die of the memory device, the set of data to the host device. In some examples, the data interface component 735 may transmit, over a bus coupled with the first memory die, a set of data including the first subset of data and the second subset of data. In some examples, the data interface component 735 may transmit the set of data to the host device using a first modulation scheme and transmit the second set of data from the first die to the host device using a second modulation scheme.

In some examples, the data interface component 735 may transmit the set of data using the first modulation scheme occurs over a first quantity of unit intervals (UIs). In some examples, the data interface component 735 may transmit the second set of data using the second modulation scheme occurs over a second quantity of UIs that is greater than the first quantity of UIs. In some examples, the data interface component 735 may transmit the set of data to the host device via a first half of the data bus and transmit the second set of data from the first die to the host device via a second half of a data bus coupled with the first die.

In some examples, transmitting the set of data via the first half of the data bus is complete before transmitting the second set of data via the second half of the data bus is complete. In some examples, the data interface component 735 may transmit the first subset to the host device before transmitting the second subset to the host device. In some examples, the data interface component 735 may transmit the first subset of data over the bus before transmitting the second subset of data over the bus.

In some examples, the data interface component 735 may transmit, over the bus and concurrently with transmitting the set of data, a second set of data including the corresponding first subset of data and the corresponding second subset of data. In some cases, the first modulation scheme includes a pulse amplitude modulation three (PAM3) or a pulse amplitude modulation four (PAM4) modulation scheme. In some cases, the second modulation scheme includes a non-return-to-zero (NRZ) modulation scheme. In some cases, the set of data and the second set of data each correspond to same burst length. In some cases, the set of data and the second set of data have a same size equal to the BL.

Figure 8:
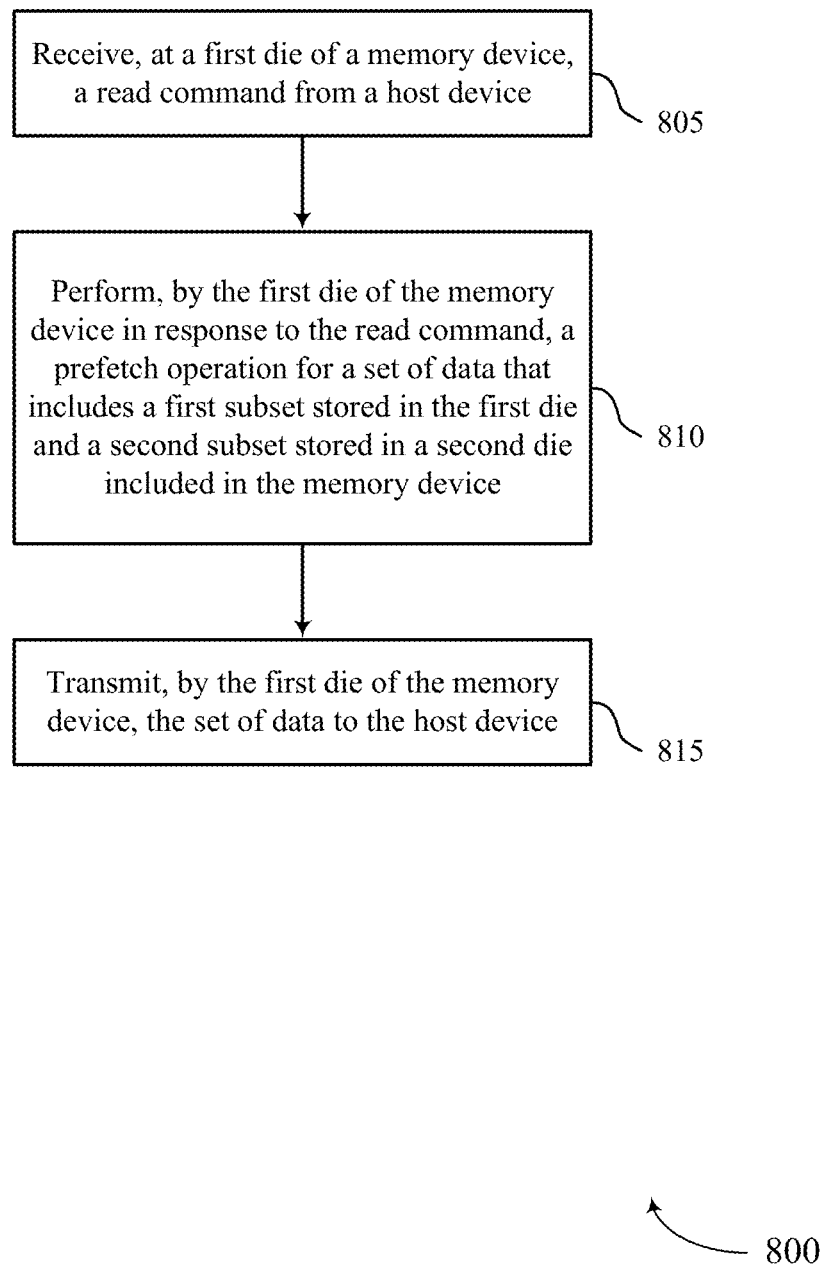
FIGS. 8 and 9 show flowcharts illustrating a method or methods that support stacked memory dice for combined access operations in accordance with examples as disclosed herein.

FIG. 8 shows a flowchart illustrating a method or methods 800 that supports stacked memory dice for combined access operations in accordance with aspects of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may receive, at a first die of a memory device, a read command from a host device. The operations of 805 may be performed according to the methods described herein. In some examples, aspects of the operations of 805 may be performed by a command interface component as described with reference to FIG. 7.

At 810, the memory device may perform, by the first die of the memory device in response to the read command, a prefetch operation for a set of data that includes a first subset stored in the first die and a second subset stored in a second die included in the memory device. The operations of 810 may be performed according to the methods described herein. In some examples, aspects of the operations of 810 may be performed by a prefetch component as described with reference to FIG. 7.

At 815, the memory device may transmit, by the first die of the memory device, the set of data to the host device. The operations of 815 may be performed according to the methods described herein. In some examples, aspects of the operations of 815 may be performed by a data interface component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for receiving, at a first die of a memory device, a read command from a host device, performing, by the first die of the memory device in response to the read command, a prefetch operation for a set of data that includes a first subset stored in the first die and a second subset stored in a second die included in the memory device, and transmitting, by the first die of the memory device, the set of data to the host device.

Some examples of the method 800 and the apparatus described herein may further include operations, features, means, or instructions for receiving, at the first die, a second read command from the host device, performing, in response to the second read command, a second prefetch operation for a second set of data that includes a respective first subset stored in the first die and a respective second subset stored in the second die, using a first modulation scheme to transmit the set of data to the host device, and transmitting the second set of data from the first die to the host device using a second modulation scheme.

In some examples of the method 800 and the apparatus described herein, the first modulation scheme includes a pulse amplitude modulation three (PAM3) or a pulse amplitude modulation four (PAM4) modulation scheme, and the second modulation scheme includes a non-return-to-zero (NRZ) modulation scheme. Some examples of the method 800 and the apparatus described herein may further include operations, features, means, or instructions for receiving, at the first die, signaling from the host device that indicates for the first die to switch from the first modulation scheme to the second modulation scheme.

In some examples of the method 800 and the apparatus described herein, transmitting the set of data using the first modulation scheme occurs over a first quantity of unit intervals (UIs), and transmitting the second set of data using the second modulation scheme occurs over a second quantity of UIs that may be greater than the first quantity of UIs. In some examples of the method 800 and the apparatus described herein, the set of data and the second set of data each correspond to same burst length.

Some examples of the method 800 and the apparatus described herein may further include operations, features, means, or instructions for receiving, at the first die, a second read command from the host device, performing, in response to the second read command, a second prefetch operation for a second set of data that includes a respective first subset stored in the first die and a respective second subset stored in the second die, transmitting the set of data to the host device via a first half of the data bus, and transmitting the second set of data from the first die to the host device via a second half of a data bus coupled with the first die. In some examples of the method 800 and the apparatus described herein, transmitting the set of data via the first half of the data bus may be complete before transmitting the second set of data via the second half of the data bus may be complete.

Some examples of the method 800 and the apparatus described herein may further include operations, features, means, or instructions for receiving the read command and the second read command via a same command and address (C/A) bus, receiving, via a first pin of the memory device, a first signal associating the read command with the first half of the data bus, and receiving, via a second pin of the memory device, a second signal associating the second read command with the second half of the data bus. In some examples of the method 800 and the apparatus described herein, transmitting the set of data to the host device may include operations, features, means, or instructions for transmitting the first subset to the host device before transmitting the second subset to the host device.

Figure 9:
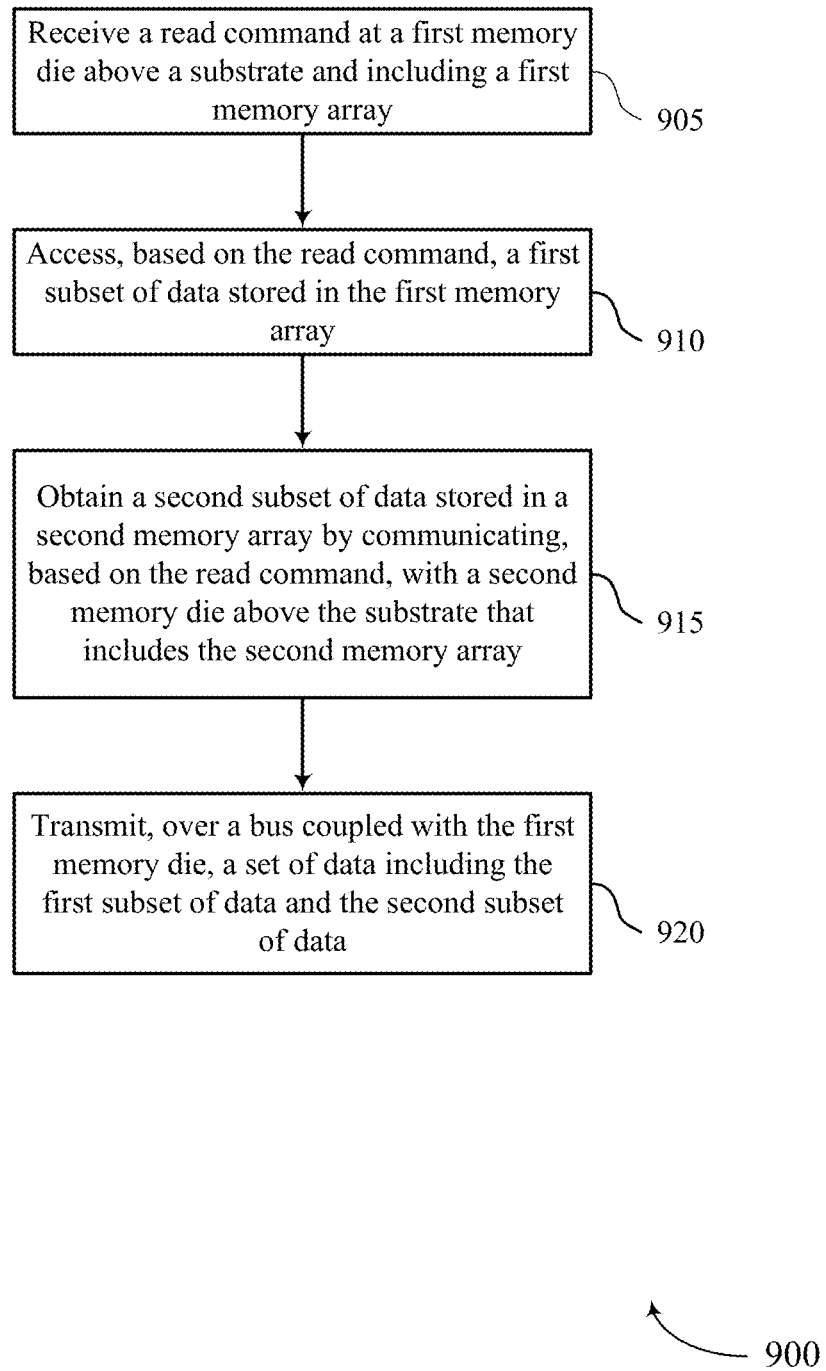

FIG. 9 shows a flowchart illustrating a method or methods 900 that supports stacked memory dice for combined access operations in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may receive a read command at a first memory die that is above a substrate and includes a first memory array. The operations of 905 may be performed according to the methods described herein. In some examples, aspects of the operations of 905 may be performed by a command interface component as described with reference to FIG. 7.

At 910, the memory device may access, based on the read command, a first subset of data stored in the first memory array. The operations of 910 may be performed according to the methods described herein. In some examples, aspects of the operations of 910 may be performed by an access component as described with reference to FIG. 7.

At 915, the memory device may obtain a second subset of data stored in a second memory array by communicating, based on the read command, with a second memory die that is above the substrate and includes the second memory array. The operations of 915 may be performed according to the methods described herein. In some examples, aspects of the operations of 915 may be performed by a master/slave logic component as described with reference to FIG. 7.

At 920, the memory device may transmit, over a bus coupled with the first memory die, a set of data including the first subset of data and the second subset of data. The operations of 920 may be performed according to the methods described herein. In some examples, aspects of the operations of 920 may be performed by a data interface component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for receiving a read command at a first memory die that is above a substrate and includes a first memory array, accessing, based on the read command, a first subset of data stored in the first memory array, obtaining a second subset of data stored in a second memory array by communicating, based on the read command, with a second memory die that is above the substrate and includes the second memory array, and transmitting, over a bus coupled with the first memory die, a set of data including the first subset of data and the second subset of data.

Some examples of the method 900 and the apparatus described herein may further include operations, features, means, or instructions for transmitting the first subset of data over the bus before transmitting the second subset of data over the bus. Some examples of the method 900 and the apparatus described herein may further include operations, features, means, or instructions for receiving, at the first memory die, an indication of a modulation scheme to use for transmitting the set of data over the bus, the first memory die supporting a set of modulation schemes that includes a first modulation scheme in which each symbol represents one bit and a second modulation scheme in which each symbol represents two or more bits, and generating symbols for transmitting the set of data over the bus in accordance with the indicated modulation scheme.

Some examples of the method 900 and the apparatus described herein may further include operations, features, means, or instructions for receiving, after receiving the read command, a second read command at the first memory die, accessing, based on the second read command, a corresponding first subset of data stored in the first memory array, obtaining, based on the second read command, a corresponding second subset of data stored in the second memory array by communicating with the second memory die, and transmitting, over the bus and concurrently with transmitting the set of data, a second set of data including the corresponding first subset of data and the corresponding second subset of data. In some examples of the method 900 and the apparatus described herein, the read command and the second read command may be each received at the first memory die via a second bus and correspond to a same burst length (BL), and the set of data and the second set of data may have a same size equal to the BL. Some examples of the method 900 and the apparatus described herein may further include operations, features, means, or instructions for obtaining the second subset of data from the second memory die concurrent with accessing at least a portion of the first subset of data.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a substrate;
   a first memory die above the substrate and configured to receive a read command and supply, based at least in part on the read command, first data that is stored in the first memory die for a first portion of a prefetch operation; and
   a second memory die above the substrate and configured to supply, to the first memory die based at least in part on the read command, second data for a second portion of the prefetch operation, the first memory die further configured to receive the second data for the second portion of the prefetch operation.

2. The apparatus of claim 1, further comprising:
   an input/output (I/O) interface included in the first memory die and configured to output, over a data bus, the second data for the second portion of the prefetch operation after the first data for the first portion of the prefetch operation.

3. The apparatus of claim 2, wherein:
   the I/O interface is configured to switch between binary signaling and multi-level signaling over the data bus; and
   the first memory die is further configured to:
     receive, from a host device, an indication to use the multi-level signaling to output the first data and the second data associated with the read command; and
     output the first data for the first portion of the prefetch operation and the second data for the second portion of the prefetch operation over the data bus, based at least in part on the indication, using the multi-level signaling.

4. The apparatus of claim 1, further comprising:
   a first input/output (I/O) interface and a second I/O interface each included in the first memory die, the first I/O interface and the second I/O interface selectively configurable to operate as a single I/O interface or as independent I/O interfaces.

5. The apparatus of claim 4, wherein the first memory die is configured to determine whether to operate the first I/O interface and the second I/O interface as the single I/O interface or as independent I/O interfaces based at least in part on configuration information.

6. The apparatus of claim 1, wherein the substrate comprises a ball-grid-array (BGA) substrate.

7. A method, comprising:
   receiving a read command at a first memory die that is above a substrate and that comprises a first memory array;
   accessing, based at least in part on the read command, a first subset of data stored in the first memory array;
   obtaining a second subset of data stored in a second memory array by communicating, based at least in part on the read command, with a second memory die that is above the substrate and that comprises the second memory array; and
   transmitting, over a bus coupled with the first memory die, a set of data comprising the first subset of data and the second subset of data.

8. The method of claim 7, further comprising:
   transmitting the first subset of data over the bus before transmitting the second subset of data over the bus.

9. The method of claim 7, further comprising:
   receiving, at the first memory die, an indication of a modulation scheme to use for transmitting the set of data over the bus, the first memory die supporting a set of modulation schemes that comprises a first modulation scheme in which each symbol represents one bit and a second modulation scheme in which each symbol represents two or more bits; and
   generating symbols for transmitting the set of data over the bus in accordance with the indicated modulation scheme.

10. The method of claim 7, further comprising:
    receiving, after receiving the read command, a second read command at the first memory die;
    accessing, based at least in part on the second read command, a corresponding first subset of data stored in the first memory array;
    obtaining, based at least in part on the second read command, a corresponding second subset of data stored in the second memory array by communicating with the second memory die; and
    transmitting, over the bus and concurrently with transmitting the set of data, a second set of data comprising the corresponding first subset of data and the corresponding second subset of data.

11. The method of claim 10, wherein:
    the read command and the second read command are each received at the first memory die via a second bus and correspond to a same burst length (BL); and
    the set of data and the second set of data have a same size equal to the BL.

12. The method of claim 7, further comprising:
    obtaining the second subset of data from the second memory die concurrent with accessing at least a portion of the first subset of data.

13. The method of claim 7, wherein the substrate comprises an array of balls, the array of balls coupled to the first memory die via one or more bond wires, and wherein receiving the read command comprises:
    receiving, from a host device, the read command via the one or more bond wires.

14. An apparatus, comprising:
    a first memory die comprising an input/output (I/O) interface, a command and address (C/A) interface, and a first memory array;
    a substrate coupled with the first memory die;
    a bus coupled with the first memory die;
    a second memory die comprising a second memory array; and circuitry coupled with the first memory die and the second memory die, the circuitry configured to cause the apparatus to:
- receive, via the C/A interface, a read command at the first memory die;
- access, based at least in part on the read command, a first subset of data stored in the first memory array;
- obtain a second subset of data stored in the second memory array by communicating, based at least in part on the read command, with the second memory die; and
- transmit, via the I/O interface and over the bus, a set of data comprising the first subset of data and the second subset of data.

15. The apparatus of claim 14, wherein the circuitry is further configured to cause the apparatus to:
- transmit the first subset of data over the I/O interface before transmitting the second subset of data over the I/O interface.

16. The apparatus of claim 14, wherein the circuitry is further configured to cause the apparatus to:
- receive, at the first memory die, an indication of a modulation scheme to use for transmitting the set of data over the bus, the first memory die supporting a set of modulation schemes that comprises a first modulation scheme in which each symbol represents one bit and a second modulation scheme in which each symbol represents two or more bits; and
- generate symbols for transmitting the set of data over the bus in accordance with the indicated modulation scheme.

17. The apparatus of claim 14, wherein the circuitry is further configured to cause the apparatus to:
- receive, after receiving the read command, a second read command at the first memory die;
- access, based at least in part on the second read command, a corresponding first subset of data stored in the first memory array;
- obtain, based at least in part on the second read command, a corresponding second subset of data stored in the second memory array by communicating with the second memory die; and
- transmitting, via the I/O interface and concurrently with transmitting the set of data, a second set of data comprising the corresponding first subset of data and the corresponding second subset of data.

18. The apparatus of claim 17, wherein:
- the read command and the second read command are each received at the first memory die via a second C/A interface and correspond to a same burst length (BL); and
- the set of data and the second set of data have a same size equal to the BL.

19. The apparatus of claim 14, wherein the circuitry is further configured to cause the apparatus to:
- obtain the second subset of data from the second memory die concurrent with accessing at least a portion of the first subset of data.

20. The apparatus of claim 14, wherein the substrate comprises an array of balls configured to connect a semiconductor package to one or more nodes of a printed-circuit board (PCB) associated with a host device.

* * * * *